(12) United States Patent
Yamazaki et al.

(10) Patent No.: US 10,910,408 B2
(45) Date of Patent: *Feb. 2, 2021

(54) DISPLAY DEVICE

(71) Applicant: Semiconductor Energy Laboratory Co., Ltd., Atsugi (JP)

(72) Inventors: Shunpei Yamazaki, Setagaya (JP); Kengo Akimoto, Atsugi (JP); Atsushi Umezaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/796,130

(22) Filed: Feb. 20, 2020

(65) Prior Publication Data

US 2020/0194466 A1 Jun. 18, 2020

Related U.S. Application Data

(63) Continuation of application No. 15/598,806, filed on May 18, 2017, now Pat. No. 10,573,665, which is a (Continued)

(30) Foreign Application Priority Data

Oct. 3, 2008 (JP) .................................. 2008-258992

(51) Int. Cl.
*H01L 27/12* (2006.01)
*H01L 27/32* (2006.01)
(Continued)

(52) U.S. Cl.
CPC ...... *H01L 27/1225* (2013.01); *G02F 1/13624* (2013.01); *H01L 27/124* (2013.01); *H01L 27/3276* (2013.01); *H01L 29/7869* (2013.01)

(58) Field of Classification Search
None
See application file for complete search history.

(56) References Cited

U.S. PATENT DOCUMENTS

| 4,470,060 A | 9/1984 | Yamazaki |
| 4,668,969 A | 5/1987 | Yamazaki |

(Continued)

FOREIGN PATENT DOCUMENTS

| EP | 0862077 A | 9/1998 |
| EP | 1132765 A | 9/2001 |

(Continued)

OTHER PUBLICATIONS

International Search Report (Application No. PCT/JP2009/067119) dated Dec. 22, 2009.

(Continued)

*Primary Examiner* — Robert K Carpenter
(74) *Attorney, Agent, or Firm* — Robinson Intellectual Property Law Office; Eric J. Robinson

(57) ABSTRACT

With an increase in the definition of a display device, the number of pixels is increased, and thus the numbers of gate lines and signal lines are increased. Due to the increase in the numbers of gate lines and signal lines, it is difficult to mount an IC chip having a driver circuit for driving the gate and signal lines by bonding or the like, which causes an increase in manufacturing costs. A pixel portion and a driver circuit for driving the pixel portion are formed over one substrate. At least a part of the driver circuit is formed using an inverted staggered thin film transistor in which an oxide semiconductor is used. The driver circuit as well as the pixel portion is provided over the same substrate, whereby manufacturing costs are reduced.

10 Claims, 30 Drawing Sheets

Related U.S. Application Data continuation of application No. 14/640,393, filed on Mar. 6, 2015, now Pat. No. 9,659,969, which is a continuation of application No. 13/651,750, filed on Oct. 15, 2012, now Pat. No. 9,048,144, which is a continuation of application No. 12/570,481, filed on Sep. 30, 2009, now Pat. No. 8,319,215.

(51) Int. Cl.
*H01L 29/786* (2006.01)
*G02F 1/1362* (2006.01)

(56) References Cited

U.S. PATENT DOCUMENTS

| | | |
|---|---|---|
| 4,816,886 A | 3/1989 | Yamazaki |
| 4,829,358 A | 5/1989 | Yamazaki |
| 5,258,635 A | 11/1993 | Nitayama et al. |
| 5,338,959 A | 8/1994 | Kim et al. |
| 5,719,065 A | 2/1998 | Takemura et al. |
| 5,731,856 A | 3/1998 | Kim et al. |
| 5,744,864 A | 4/1998 | Cillessen et al. |
| 5,830,785 A | 11/1998 | Sanson et al. |
| 5,847,410 A | 12/1998 | Nakajima |
| 5,945,711 A | 8/1999 | Takemura et al. |
| 6,294,274 B1 | 9/2001 | Kawazoe et al. |
| 6,330,044 B1 | 12/2001 | Murade |
| 6,335,555 B1 | 1/2002 | Takemura et al. |
| 6,563,174 B2 | 5/2003 | Kawasaki et al. |
| 6,586,346 B1 | 7/2003 | Yamazaki et al. |
| 6,657,260 B2 | 12/2003 | Yamazaki et al. |
| 6,704,068 B2 | 3/2004 | Murade |
| 6,717,633 B2 | 4/2004 | Murade |
| 6,727,522 B1 | 4/2004 | Kawasaki et al. |
| 6,835,607 B2 | 12/2004 | Takemura et al. |
| 6,960,812 B2 | 11/2005 | Yamazaki et al. |
| 6,984,550 B2 | 1/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,170,138 B2 | 1/2007 | Takemura et al. |
| 7,189,992 B2 | 3/2007 | Wager, III et al. |
| 7,211,825 B2 | 5/2007 | Shih et al. |
| 7,211,826 B2 | 5/2007 | Park et al. |
| 7,218,048 B2 | 5/2007 | Choi et al. |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,301,209 B2 | 11/2007 | Takemura et al. |
| 7,301,211 B2 | 11/2007 | Yamazaki et al. |
| 7,323,356 B2 | 1/2008 | Hosono et al. |
| 7,339,187 B2 | 3/2008 | Wager, III et al. |
| 7,351,623 B2 | 4/2008 | Ahn |
| 7,385,224 B2 | 6/2008 | Ishii et al. |
| 7,402,506 B2 | 7/2008 | Levy et al. |
| 7,405,115 B2 | 7/2008 | Yamazaki et al. |
| 7,411,209 B2 | 8/2008 | Endo et al. |
| 7,435,633 B2 | 10/2008 | Todorokihara et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,987 B2 | 2/2009 | Genrikh et al. |
| 7,501,293 B2 | 3/2009 | Ito et al. |
| 7,553,712 B2 | 6/2009 | Shyu |
| 7,554,618 B2 | 6/2009 | Ishii et al. |
| 7,564,055 B2 | 7/2009 | Hoffman |
| 7,601,984 B2 | 10/2009 | Sano et al. |
| 7,609,348 B2 | 10/2009 | Nakayama et al. |
| 7,615,786 B2 | 11/2009 | Takemura et al. |
| 7,645,478 B2 | 1/2010 | Thelss et al. |
| 7,648,861 B2 | 1/2010 | Yamazaki et al. |
| 7,674,650 B2 | 3/2010 | Akimoto et al. |
| 7,675,065 B2 | 3/2010 | You et al. |
| 7,687,807 B2 | 3/2010 | Koo et al. |
| 7,732,819 B2 | 6/2010 | Akimoto et al. |
| 7,781,964 B2 | 8/2010 | Hara et al. |
| 7,791,082 B2 | 9/2010 | Iwasaki |
| 7,804,091 B2 | 9/2010 | Takechi et al. |
| 7,847,287 B2 | 12/2010 | Kim et al. |
| 7,863,611 B2 | 1/2011 | Abe et al. |
| 7,863,619 B2 | 1/2011 | Takemura et al. |
| 7,884,360 B2 | 2/2011 | Takechi et al. |
| 7,888,207 B2 | 2/2011 | Wager, III et al. |
| 7,978,274 B2 | 7/2011 | Umezaki et al. |
| 7,998,372 B2 | 8/2011 | Yano et al. |
| 8,045,072 B2 | 10/2011 | Ahn |
| 8,053,339 B2 | 11/2011 | Yamazaki et al. |
| 8,053,778 B2 | 11/2011 | Takemura et al. |
| 8,143,115 B2 | 3/2012 | Omura et al. |
| 8,148,721 B2 | 4/2012 | Hayashi et al. |
| 8,203,146 B2 | 6/2012 | Abe et al. |
| 8,232,124 B2 | 7/2012 | Takechi et al. |
| 8,319,215 B2 | 11/2012 | Yamazaki et al. |
| 8,319,219 B2 | 11/2012 | Yamazaki |
| 8,324,693 B2 | 12/2012 | Takemura et al. |
| 8,373,166 B2 | 2/2013 | Yamazaki |
| 8,400,599 B2 | 3/2013 | Chang et al. |
| 8,420,442 B2 | 4/2013 | Takechi et al. |
| 8,520,159 B2 | 8/2013 | Umezaki et al. |
| 8,735,889 B2 | 5/2014 | Yamazaki et al. |
| 8,735,896 B2 | 5/2014 | Yamazaki |
| 8,908,115 B2 | 12/2014 | Umezaki et al. |
| 9,048,144 B2 * | 6/2015 | Yamazaki ............. H01L 27/124 |
| 9,263,468 B2 | 2/2016 | Umezaki et al. |
| 9,330,940 B2 | 5/2016 | Yamazaki et al. |
| 2001/0030323 A1 | 10/2001 | Ikeda |
| 2001/0046027 A1 | 11/2001 | Tai et al. |
| 2002/0043662 A1 | 4/2002 | Yamazaki et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0198008 A1 | 10/2003 | Leapman et al. |
| 2003/0218222 A1 | 11/2003 | Wager, III et al. |
| 2004/0038446 A1 | 2/2004 | Takeda et al. |
| 2004/0051823 A1 | 3/2004 | Choi |
| 2004/0127038 A1 | 7/2004 | Carcia et al. |
| 2004/0184027 A1 | 9/2004 | Mizutani et al. |
| 2005/0017244 A1 | 1/2005 | Hoffman et al. |
| 2005/0017302 A1 | 1/2005 | Hoffman |
| 2005/0162579 A1 | 7/2005 | Jeong et al. |
| 2005/0199959 A1 | 9/2005 | Chiang et al. |
| 2005/0199960 A1 | 9/2005 | Hoffman et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0273316 A1 | 12/2006 | Yang et al. |
| 2006/0284171 A1 | 12/2006 | Levy et al. |
| 2006/0284172 A1 | 12/2006 | Ishii |
| 2006/0292726 A1 | 12/2006 | Akimoto et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |

(56) References Cited

U.S. PATENT DOCUMENTS

| | | |
|---|---|---|
| 2007/0072439 A1 | 3/2007 | Akimoto et al. |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0152217 A1 | 7/2007 | Lai et al. |
| 2007/0171157 A1 | 7/2007 | Choi et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0272948 A1 | 11/2007 | Koo et al. |
| 2007/0287296 A1 | 12/2007 | Chang |
| 2008/0006858 A1 | 1/2008 | Liu |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042217 A1 | 2/2008 | Jeong et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0143653 A1 | 6/2008 | Shishido |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0084650 A1 | 4/2010 | Yamazaki et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0252826 A1 | 10/2010 | Yamazaki et al. |
| 2010/0301326 A1 | 12/2010 | Miyairi et al. |
| 2012/0168750 A1 | 7/2012 | Hayashi et al. |
| 2013/0176515 A1 | 7/2013 | Chang et al. |
| 2013/0237012 A1 | 9/2013 | Takechi et al. |
| 2013/0277672 A1 | 10/2013 | Sano et al. |
| 2015/0084048 A1 | 3/2015 | Hayashi et al. |
| 2016/0141309 A1 | 5/2016 | Umezaki et al. |

FOREIGN PATENT DOCUMENTS

| | | |
|---|---|---|
| EP | 1237195 A | 9/2002 |
| EP | 1355221 A | 10/2003 |
| EP | 1737044 A | 12/2006 |
| EP | 1890188 A | 2/2008 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-071556 A | 3/1990 |
| JP | 02-156676 A | 6/1990 |
| JP | 04-043677 A | 2/1992 |
| JP | 04-206836 A | 7/1992 |
| JP | 05-066853 A | 3/1993 |
| JP | 05-251705 A | 9/1993 |
| JP | 05-283698 A | 10/1993 |
| JP | 06-202156 A | 7/1994 |
| JP | 08-264794 A | 10/1996 |
| JP | 09-506738 | 6/1997 |
| JP | 10-290012 A | 10/1998 |
| JP | 10-301100 A | 11/1998 |
| JP | 11-505377 | 5/1999 |
| JP | 2000-044236 A | 2/2000 |
| JP | 2000-150900 A | 5/2000 |
| JP | 2000-195815 A | 7/2000 |
| JP | 2001-250949 A | 9/2001 |
| JP | 2002-031818 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174173 A | 6/2003 |
| JP | 2003-273228 A | 9/2003 |
| JP | 2003-280034 A | 10/2003 |
| JP | 2003-309266 A | 10/2003 |
| JP | 2004-103957 A | 4/2004 |
| JP | 2004-273614 A | 9/2004 |
| JP | 2004-273732 A | 9/2004 |
| JP | 2005-078073 A | 3/2005 |
| JP | 2005-303220 A | 10/2005 |
| JP | 2005-338855 A | 12/2005 |
| JP | 2006-502597 | 1/2006 |
| JP | 2006-080495 A | 3/2006 |
| JP | 2006-106106 A | 4/2006 |
| JP | 2006-128665 A | 5/2006 |
| JP | 2006-165529 A | 6/2006 |
| JP | 2006-165532 A | 6/2006 |
| JP | 2006-338008 A | 12/2006 |
| JP | 2007-096055 A | 4/2007 |
| JP | 2007-123861 A | 5/2007 |
| JP | 2007-142195 A | 6/2007 |
| JP | 2007-150158 A | 6/2007 |
| JP | 2007-155962 A | 6/2007 |
| JP | 2007-213065 A | 8/2007 |
| JP | 2007-299913 A | 11/2007 |
| JP | 2008-040343 A | 2/2008 |
| JP | 2008-042088 A | 2/2008 |
| JP | 2008-046625 A | 2/2008 |
| JP | 2008-085048 A | 4/2008 |
| JP | 2008-091896 A | 4/2008 |
| JP | 2008-096708 A | 4/2008 |
| JP | 2008-519292 | 6/2008 |
| JP | 2008-166716 A | 7/2008 |
| JP | 2008-186427 A | 8/2008 |
| JP | 2008-537631 | 9/2008 |
| KR | 2003-0082913 A | 10/2003 |
| KR | 10-0637228 | 10/2006 |
| KR | 2007-0085134 A | 8/2007 |
| KR | 2007-0093831 A | 9/2007 |
| KR | 2007-0113737 A | 11/2007 |

(56) References Cited

FOREIGN PATENT DOCUMENTS

| KR | 2008-0029796 A | 4/2008 |
|---|---|---|
| TW | 200511589 | 3/2005 |
| TW | 200514009 | 4/2005 |
| TW | 200801672 | 1/2008 |
| WO | WO-2004/038757 | 5/2004 |
| WO | WO-2004/114391 | 12/2004 |
| WO | WO-2005/015643 | 2/2005 |
| WO | WO-2005/074038 | 8/2005 |
| WO | WO-2006/049859 | 5/2006 |
| WO | WO-2006/051993 | 5/2006 |
| WO | WO-2006/064822 | 6/2006 |
| WO | WO-2006/105028 | 10/2006 |
| WO | WO-2008/069056 | 6/2008 |
| WO | WO-2008/069255 | 6/2008 |

OTHER PUBLICATIONS

Written Opinion (Application No. PCT/JP2009/067119) dated Dec. 22, 2009.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Cho.Y et al., "Characteristics of a-Si:H Dual-Gate TFTs Using ITO Electrode for LCD Driver", AM-FPD '08 Digest of Technical Papers, Jul. 2, 2008, pp. 229-232.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Takahashi.K et al., "4p-N-10 Back-channel control in amorphous In—Ga—Zn—O TFTs", 69th Japan Society of Applied Physics, Sep. 1, 2008, No. 2, p. 851.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-INCH) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical: Papers, Jul. 2, 2008, pp. 251-252, The Japan Society of Applied Physics.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and Sn-Doped Zinc Indium Oxide Thin Film Transistors for AMOLED Back. Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the In2O3 and Sc2O3—A2O3—Bo Systems [A; Fe, Ga, Or Al; B: Mg, Mn, Fe, Ni, Cu,or Zn]at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 53, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al.,"Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Taiwanese Office Action (Application No. 98133405) dated Nov. 3, 2014.
Korean Office Action (Application No. 2015-7035377) dated Jan. 21, 2016.
Korean Office Action (Application No. 2016-7025822) dated Nov. 18, 2016.
Korean Office Action (Application No. 2017-7031984) dated Jul. 18, 2018.

* cited by examiner

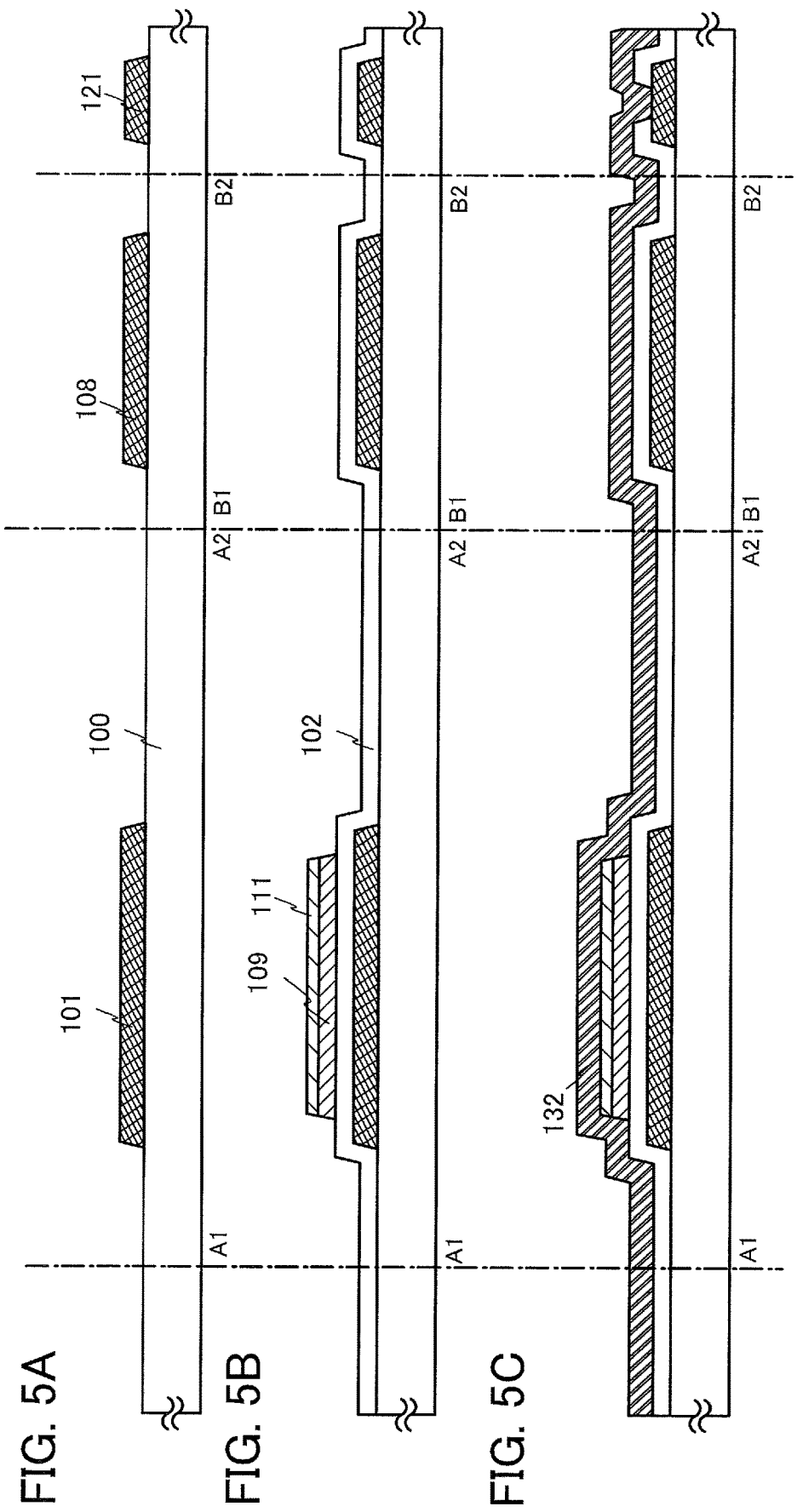

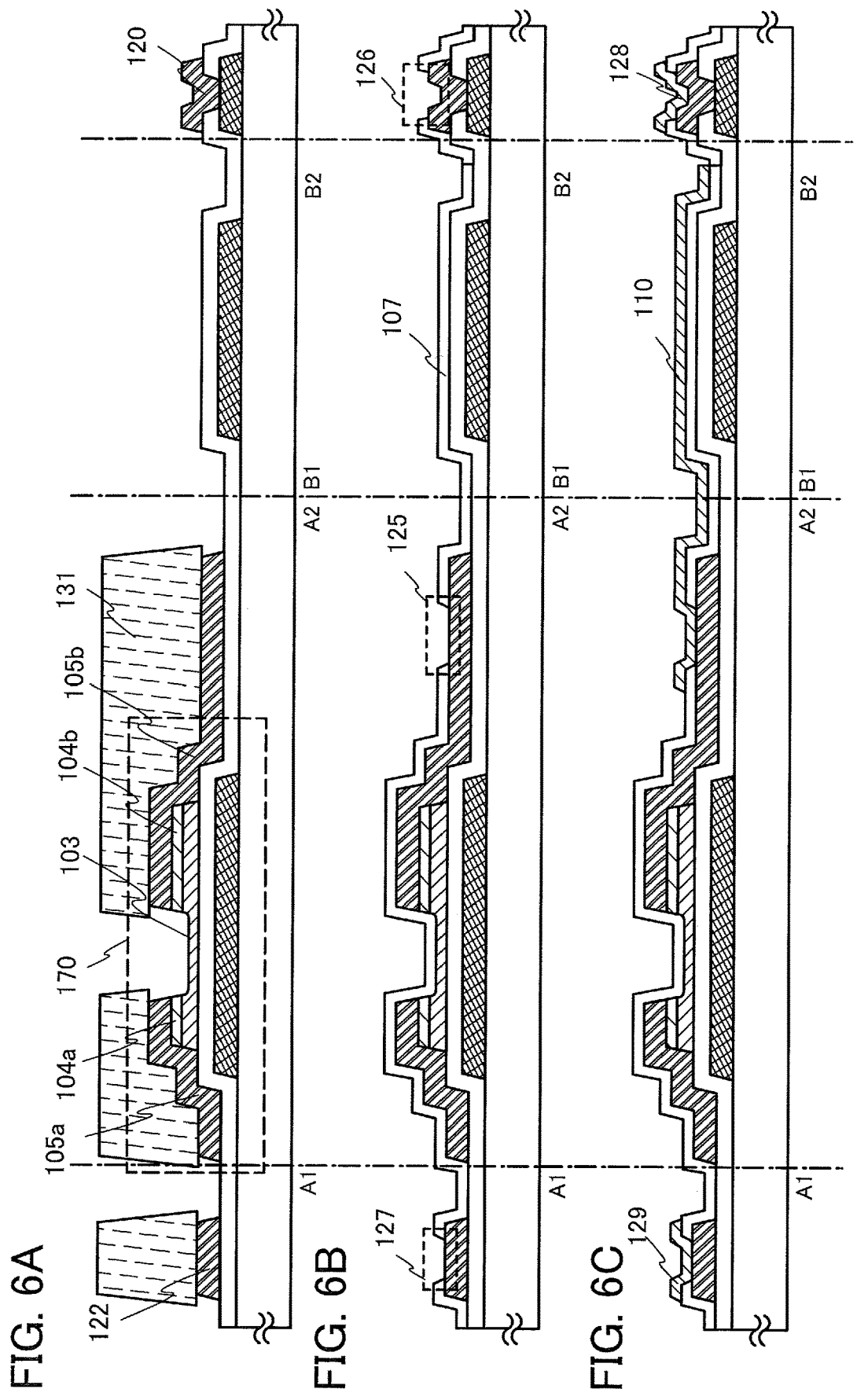

FIG. 11A1
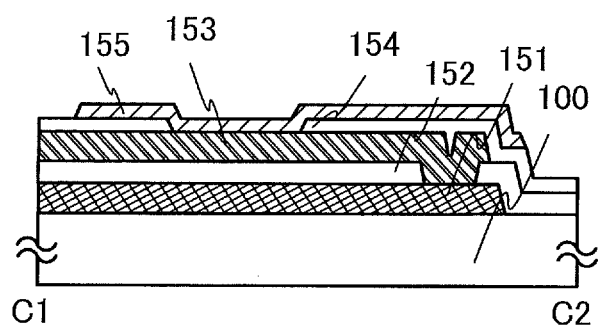
FIG. 11A2
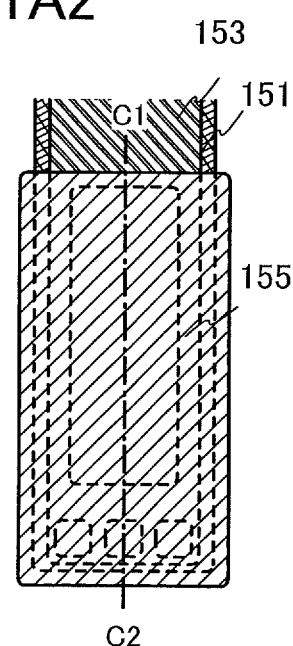
FIG. 11B1
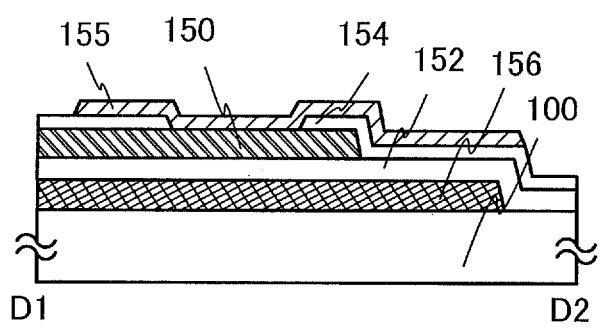
FIG. 11B2
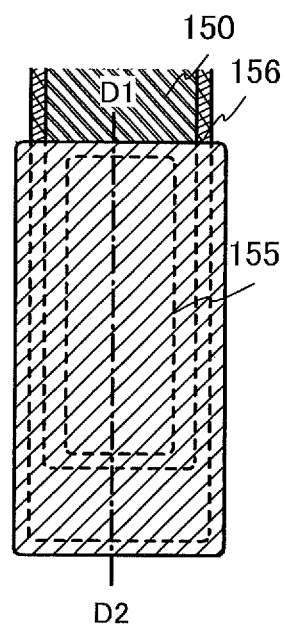

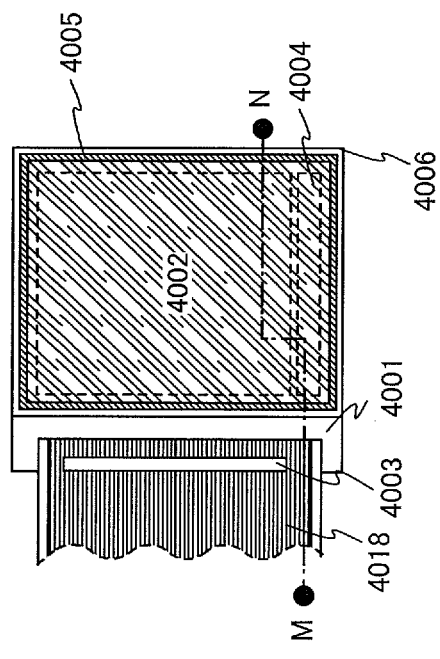
FIG. 22A1
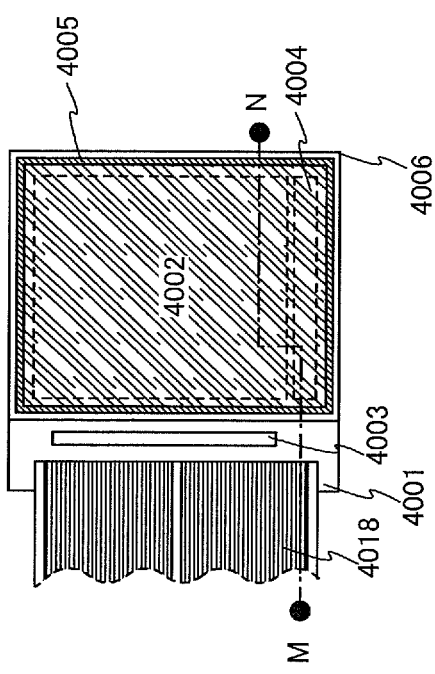
FIG. 22A2
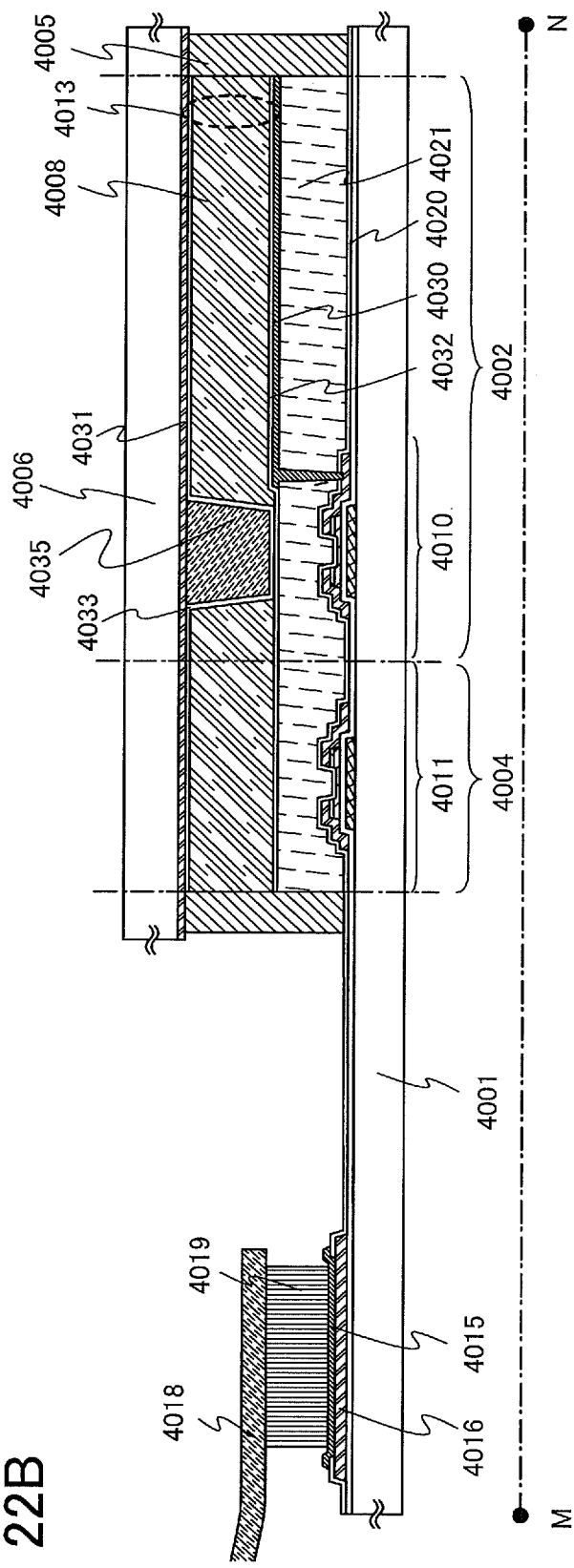
FIG. 22B

DISPLAY DEVICE

TECHNICAL FIELD

The present invention relates to a display device in which an oxide semiconductor is used and a method for manufacturing the display device.

BACKGROUND ART

As typically seen in a liquid crystal display device, a thin film transistor formed over a flat plate such as a glass substrate is manufactured using amorphous silicon or polycrystalline silicon. Thin film transistors manufactured using amorphous silicon has low field effect mobility, but can be formed over a larger glass substrate. In contrast, thin film transistors manufactured using crystalline silicon has high field effect mobility, but due to a crystallization step such as laser annealing, the transistors are not always suitable for being formed over a larger glass substrate.

In view of the foregoing, attention has been drawn to a technique for by which a thin film transistor is manufactured using an oxide semiconductor and such a transistor is applied to an electronic appliance or an optical device. For example, Patent Document 1 and Patent Document 2 disclose a technique by which a thin film transistor is manufactured using zinc oxide or an In—Ga—Zn—O-based oxide semiconductor for an oxide semiconductor film and such a transistor is used as a switching element or the like of an image display device.

PATENT DOCUMENT

[Patent Document 1] Japanese Published Patent Application No. 2007-123861
[Patent Document 2] Japanese Published Patent Application No. 2007-96055

DISCLOSURE OF THE INVENTION

The field effect mobility of a thin film transistor using an oxide semiconductor for a channel formation region is higher than that of a thin film transistor using amorphous silicon. The oxide semiconductor film can be formed by a sputtering method or the like at a temperature lower than or equal to 300° C. Its manufacturing process is easier than that of a thin film transistor using polycrystalline silicon.

Such an oxide semiconductor is expected to be used for forming a thin film transistor on a glass substrate, a plastic substrate, or the like, and to be applied to a liquid crystal display device, an electroluminescent display device, an electronic paper, or the like.

With an increase in the definition of a display device, the number of pixels is increased, and thus the numbers of gate lines and signal lines are increased. Due to the increase in the numbers of gate lines and signal lines, it is difficult to mount an IC chip having a driver circuit for driving the gate and signal lines by bonding or the like, which causes an increase in manufacturing costs.

Further, another object of the present invention is to reduce contact resistance or the like between wirings that connect elements in order to achieve high-speed driving of the driver circuit. For example, high contact resistance between a gate wiring and an upper wiring might distort an input signal.

Further, another object of the present invention is to provide a structure of a display device in which the number of contact holes and an area occupied by a driver circuit is reduced.

A pixel portion and a driver circuit for driving the pixel portion are formed over one substrate. At least a part of the driver circuit is formed using an inverted staggered thin film transistor in which an oxide semiconductor is used. The driver circuit as well as the pixel portion is provided over the same substrate, whereby manufacturing costs are reduced.

As an oxide semiconductor used in this specification, a thin film of a material represented by $InMO_3(ZnO)_m$ (m>0) is formed, and a thin film transistor in which the thin film is used as a semiconductor layer is manufactured. Note that M denotes one or more of metal elements selected from gallium (Ga), iron (Fe), nickel (Ni), manganese (Mn), and cobalt (Co). In addition to a case where only Ga is contained as M, there is a case where Ga and any of the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M. In this specification, this thin film is also referred to as an "In—Ga—Zn—O-based non-single-crystal film".

Table 1 shows a typical example of measurement by inductively coupled plasma mass spectrometry (ICP-MS). An oxide semiconductor film of $InGa_{0.95}Zn_{0.41}O_{3.33}$ is obtained under Condition 1 where a target in which the ratio of $In_2O_3$ to $Ga_2O_3$ and ZnO is 1:1:1 (the ratio of In to Ga and Zn being 1:1:0.5) is used and the flow rate of an argon gas in a sputtering method is 40 sccm. In addition, an oxide semiconductor film of $InGa_{0.94}Zn_{0.40}O_{3.31}$ is obtained under Condition 2 where the flow rates of an argon gas and oxygen in a sputtering method are 10 sccm and 5 sccm, respectively.

TABLE 1

| Flow Ratio | Composition (Atomic %) | | | | |
|---|---|---|---|---|---|
| $Ar/O_2$ | In | Ga | Zn | O | Composition Formula |
| 40/0 | 17.6 | 16.7 | 7.2 | 58.6 | $InGa_{0.95}Zn_{0.41}O_{3.33}$ |
| 10/5 | 17.7 | 16.7 | 7 | 58.6 | $InGa_{0.94}Zn_{0.40}O_{3.31}$ |

Further, Table 2 shows results of quantification performed using Rutherford backscattering spectrometry (RBS) instead of ICP-MS.

TABLE 2

| Flow Ratio | Composition (Atomic %) | | | | | |
|---|---|---|---|---|---|---|
| $Ar/O_2$ | In | Ga | Zn | O | Ar | Composition Formula |
| 40/0 | 17 | 15.8 | 7.5 | 59.4 | 0.3 | $InGa_{0.93}Zn_{0.44}O_{3.49}$ |
| 10/5 | 16 | 14.7 | 7.2 | 61.7 | 0.4 | $InGa_{0.92}Zn_{0.45}O_{3.86}$ |

According to the results of the measurement of the sample in Condition 1 by RBS, the oxide semiconductor film is $InGa_{0.93}Zn_{0.44}O_{3.49}$. In addition, according to the results of the measurement of the sample in Condition 2 by RBS, the oxide semiconductor film is $InGa_{0.92}Zn_{0.45}O_{3.86}$.

An amorphous structure is observed in the In—Ga—Zn—O-based non-single-crystal film by X-ray diffraction (XRD). Note that heat treatment is performed on the In—Ga—Zn—O-based non-single-crystal film of the examined sample at 200 to 500° C., typically 300 to 400° C., for 10 minutes to 100 minutes after the film is formed by a sputtering method. In addition, a thin film transistor having electric characteristics such as an on/off ratio of greater than or equal to $10^9$ and a mobility of greater than or equal to 10 at a gate voltage of ±20 V can be manufactured.

It is effective to use a thin film transistor having such electric characteristics for a driver circuit. For example, a gate line driver circuit includes a shift register circuit for sequentially transferring gate signals, a buffer circuit, and the like; and a source line driver circuit includes a shift register for sequentially transferring gate signals, an analog switch for switching on and off of transfer of an image signal to a pixel, and the like. A TFT in which an oxide semiconductor film is used has a higher mobility than a TFT in which amorphous silicon is used and is capable of driving a shift register circuit at high speed.

Further, when at least a part of a driver circuit for driving a pixel portion is formed using a thin film transistor in which an oxide semiconductor is used, the TFTs included in the circuit are all n-channel TFTs, and a circuit illustrated in FIG. 1B is used as a basic unit. In addition, in the driver circuit, a gate electrode is directly connected to a source wiring or a drain wiring, whereby a favorable contact can be obtained, which leads to a reduction in contact resistance. In the driver circuit, connecting the gate electrode to a source wiring or a drain wiring with another conductive film, e.g., a transparent conductive film might cause an increase in the number of contact holes, an increase in an area occupied by the contact holes due to the increase in the number of contact holes, or an increase in contact resistance and wiring resistance, and might even complicate the process.

An embodiment of the present invention which is disclosed in this specification is a display device including a pixel portion and a driver circuit. The pixel portion includes a first thin film transistor including at least a first oxide semiconductor layer. The driver circuit includes a second thin film transistor including at least a second oxide semiconductor layer and a third thin film transistor including a third oxide semiconductor layer. A wiring that is in direct contact with a gate electrode of the second thin film transistor provided below the second oxide semiconductor layer is provided above the third oxide semiconductor layer. The wiring is a source or drain wiring of the third thin film transistor which is electrically connected to the third oxide semiconductor layer.

An embodiment of the present invention achieves at least one of the above objects.

Further, the thin film transistor used for an embodiment of the present invention may include a fourth oxide semiconductor layer having smaller thickness and higher conductivity than the third oxide semiconductor layer, between the source wiring and the oxide semiconductor layer serving as a channel formation region (the third semiconductor layer in the above structure) or between the drain wiring and the oxide semiconductor layer serving as the channel formation region (the third semiconductor layer in the above structure).

The fourth oxide semiconductor layer exhibits n-type conductivity and functions as a source or drain region.

The third oxide semiconductor layer may have an amorphous structure, and the fourth oxide semiconductor layer may include crystal grains (nanocrystals) in an amorphous structure. These crystal grains (nanocrystals) in the fourth oxide semiconductor layer each have a diameter of 1 to 10 nm, typically about 2 to 4 nm.

Further, as the fourth oxide semiconductor layer serving as a source or drain region (an $n^+$-type layer), an In—Ga—Zn—O-based non-single-crystal film can be used.

An insulating layer may be provided to cover the first thin film transistor, the second thin film transistor, and the third thin film transistor which are included in the display device and to be in contact with the first oxide semiconductor layer, the second oxide semiconductor layer, and the third oxide semiconductor layer. Further, in an etching step of the wiring, the oxide semiconductor layer may be partly etched. In that case, the first oxide semiconductor layer, the second oxide semiconductor layer, and the third oxide semiconductor layer each include a region with a small thickness.

Further, since the thin film transistor is easily broken by static electricity and the like, a protection circuit for protecting the driver circuits is preferably provided over the same substrate for a gate line or a source line. The protection circuit is preferably formed using a nonlinear element in which an oxide semiconductor is used.

Note that ordinal numbers such as "first" and "second" in this specification are used for convenience. Therefore, they do not denote the order of steps, the stacking order of layers, and particular names which specify the invention.

Moreover, as a display device including a driver circuit, a light-emitting display device in which a light-emitting element is used and a display device in which an electrophoretic display element is used, which is also referred to as an "electronic paper", are given in addition to a liquid crystal display device.

In the light-emitting display device in which a light-emitting element is used, a plurality of thin film transistors are included in a pixel portion, and also in the pixel portion, there is a region where a gate electrode of one thin film transistor is directly connected to a source wiring or a drain wiring of another transistor. In addition, in the driver circuit of the light-emitting display device in which a light-emitting element is used, there is a region where a gate electrode of a thin film transistor is directly connected to a source wiring or a drain wiring of the thin film transistor.

Note that the semiconductor device in this specification refers to all the devices which can operate by using semiconductor characteristics, and an electro-optical device, a semiconductor circuit, and an electronic appliance are all semiconductor devices.

A thin film transistor in which an oxide semiconductor is used in a gate line driver circuit or source line driver circuit, whereby manufacturing costs can be reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

Therefore, according to an embodiment of the present invention, a display device having excellent electrical properties and high reliability can be provided at low costs.

BRIEF DESCRIPTION OF THE DRAWINGS

FIGS. 5A to 5C illustrate a method for manufacturing a semiconductor device.

FIGS. 6A to 6C illustrate a method for manufacturing a semiconductor device.

FIGS. 11A1 to 11B2 illustrate a semiconductor device.

FIGS. 22A1 to 22B illustrate a semiconductor device.

BEST MODE FOR CARRYING OUT THE INVENTION

Figure 1A:
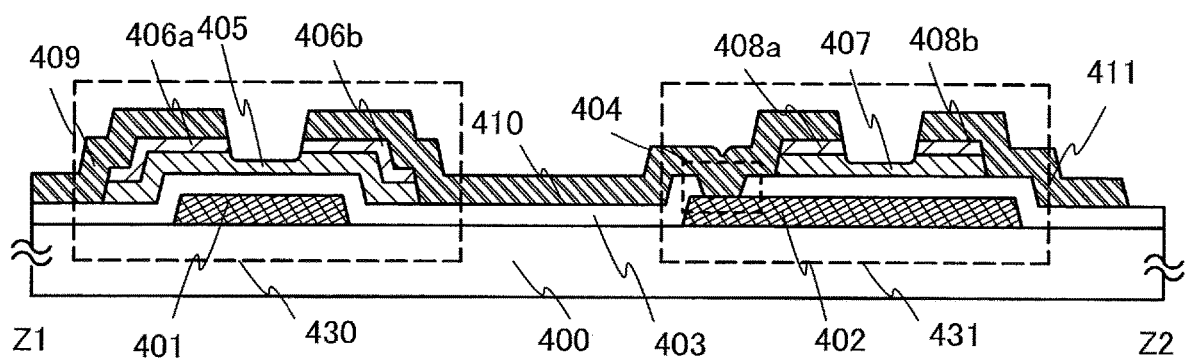
FIGS. 1A to 1C illustrate a semiconductor device.

Embodiments will be described in detail with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention described below, like portions or portions having like functions in different drawings are denoted by the like reference numerals and repeated description thereof is omitted.

Embodiment 1

In this embodiment, an embodiment of the present invention will be described based on an example in which an inverter circuit is formed using two n-channel thin film transistors.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, on and off of voltage application to a pixel electrode is switched using enhancement type transistors arranged in a matrix. An oxide semiconductor is used for these enhancement type transistors arranged in the pixel portion. Since the enhancement type transistor has electric characteristics such as an on/off ratio of greater than or equal to $10^9$ at a gate voltage of ±20 V, leakage current is small and low power consumption drive can be realized.

Figure 1B:
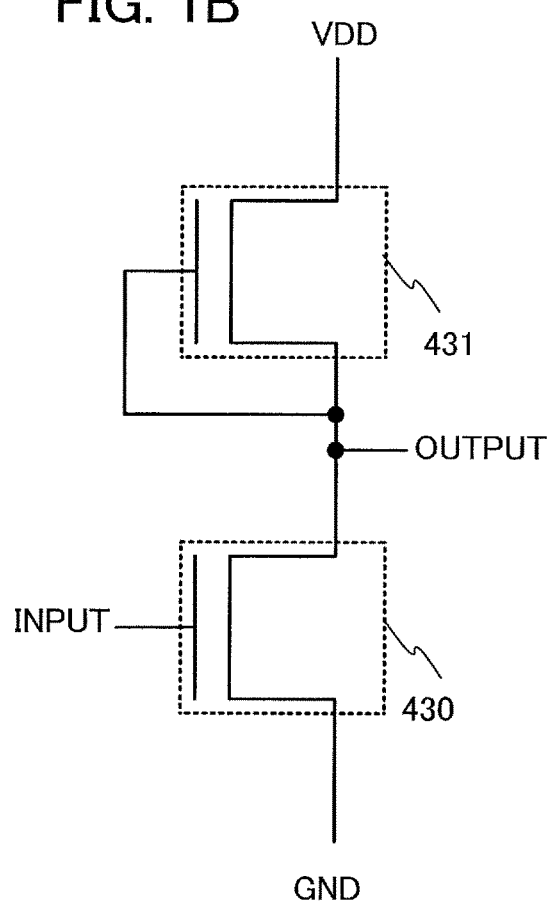
Figure 1C:
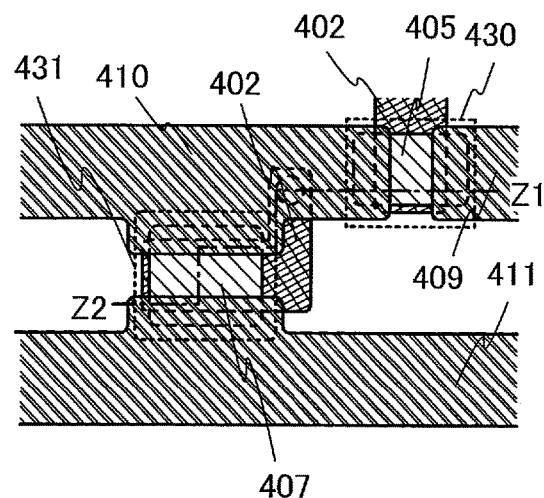

FIG. 1A illustrates a cross-sectional structure of the inverter circuit of the driver circuit. Note that a first thin film transistor 430 and a second thin film transistor 431 which are illustrated in FIGS. 1A to 1C are each an inverted staggered thin film transistor and exemplifies a thin film transistor in which a wiring is provided over a semiconductor layer with a source or drain regions interposed therebetween.

In FIG. 1A, a first gate electrode 401 and a second gate electrode 402 are provided over a substrate 400. The first gate electrode 401 and the second gate electrode 402 can be formed to have a single-layer structure or a stacked-layer structure using a metal material such as molybdenum, titanium, chromium, tantalum, tungsten, aluminum, copper, neodymium, or scandium, or an alloy material containing any of these materials as the main component.

For example, as a two-layer structure of each of the first gate electrode 401 and the second gate electrode 402, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Further, over a gate insulating layer 403 covering the first gate electrode 401 and the second gate electrode 402, a first oxide semiconductor layer 405 and a second oxide semiconductor layer 407 are provided.

Further, over the first oxide semiconductor layer 405, a first wiring 409 and a second wiring 410 are provided. The second wiring 410 is directly connected to the second gate electrode 402 through a contact hole 404 formed in the gate insulating layer 403. In addition, a third wiring 411 is provided over the second oxide semiconductor layer 407.

The first thin film transistor 430 includes the first gate electrode 401 and the first oxide semiconductor layer 405 overlapped with the first gate electrode 401 with the gate insulating layer 403 interposed therebetween, and the first wiring 409 is a power supply line at a ground potential (a ground power supply line). This power supply line at a ground potential may be a power supply line to which a negative voltage VDL is applied (a negative power supply line).

In addition, the second thin film transistor 431 includes the second gate electrode 402 and the second oxide semiconductor layer 407 overlapped with the second gate electrode 402 with the gate insulating layer 403 interposed therebetween. The third wiring 411 is a power supply line to which a positive voltage VDD is applied (a positive power supply line).

An $n^+$-type layer 406a is provided between the first oxide semiconductor layer 405 and the first wiring 409, and an $n^+$-type layer 406b is provided between the first oxide semiconductor layer 405 and the second wiring 410. Further, an $n^+$-type layer 408a is provided between the second oxide semiconductor layer 407 and the second wiring 410, and an $n^+$-type layer 408b is provided between the second oxide semiconductor layer 407 and the third wiring 411.

In this Embodiment, the $n^+$-type layers 406a, 406b, 408a, and 408b each functioning as a source region or a drain region are formed of In—Ga—Zn—O-based non-single-crystal films, and deposition conditions thereof are different from those of the first oxide semiconductor layer 405 and the second oxide semiconductor layer 407. The $n^+$-type layers 406a, 406b, 408a, and 408b are oxide semiconductor layers having lower resistance than the first oxide semiconductor layer 405 and the second oxide semiconductor layer 407. For example, when formed of oxide semiconductor films under Condition 1 shown in the above Table 1 where a sputtering method is employed and the flow rate of an argon gas is 40 sccm in a sputtering method, the $n^+$-type layers 406a, 406b, 408a, and 408b have n-type conductivity and an activation energy (4E) of from 0.01 to 0.1 eV. Note that in this embodiment, the $n^+$-type layers 406a, 406b, 408a, and 408b are In—Ga—Zn—O-based non-single-crystal films and include at least an amorphous component. The $n^+$-type layers 406a, 406b, 408a, and 408b may include crystal grains (nanocrystals) in an amorphous structure. These crystal grains (nanocrystals) in the $n^+$-type layers 406a, 406b, 408a, and 408b each have a diameter of 1 to 10 nm, typically about 2 to 4 nm.

By the provision of the $n^+$-type layers 406a, 406b, 408a, and 408b, the first wiring 409 and the second wiring 410 which are metal layers can have a good junction with the first oxide semiconductor layer 405, and the second wiring 410 and the third wiring 411 which are metal layers can have a good junction with the second oxide semiconductor layer 407, so that stable operation can be realized in terms of heat in comparison with a Schottky junction. In addition, provision of the $n^+$-type layer is positively effective in supplying carriers to the channel (on the source side), stably absorbing carriers from the channel (on the drain side), or preventing resistance from being generated at an interface between the wiring and the oxide semiconductor layer. Moreover, since resistance is reduced, good mobility can be ensured even with a high drain voltage.

As illustrated in FIG. 1A, the second wiring 410 which is electrically connected to both the first oxide semiconductor layer 405 and the second oxide semiconductor layer 407 is directly connected to the second gate electrode 402 of the second thin film transistor 431 through the contact hole 404 formed in the gate insulating layer 403. By the direct connection, favorable contact can be obtained, which leads to a reduction in contact resistance. In comparison with the case where the second gate electrode 402 and the second wiring 410 are connected to each other with another conductive film, e.g., a transparent conductive film, a reduction in the number of contact holes and a reduction in an area occupied by the driver circuit due to the reduction in the number of contact holes can be achieved.

Further, FIG. 1C is a top view of the inverter circuit of the driver circuit. In FIG. 1C, a cross section taken along the chain line Z1-Z2 corresponds to FIG. 1A.

Further, FIG. 1B illustrates an equivalent circuit of the EDMOS circuit. The circuit connection illustrated in FIGS. 1A and 1C corresponds to that illustrated in FIG. 1B. An example in which the first thin film transistor 430 is an enhancement type n-channel transistor and the second thin film transistor 431 is a depletion-type n-channel transistor is illustrated.

In order to manufacture an enhancement type n-channel transistor and a depletion-type n-channel transistor over the same substrate, for example, the first oxide semiconductor layer 405 and the second semiconductor layer 407 are formed using different materials or under different conditions. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Embodiment 2

Figure 2A:
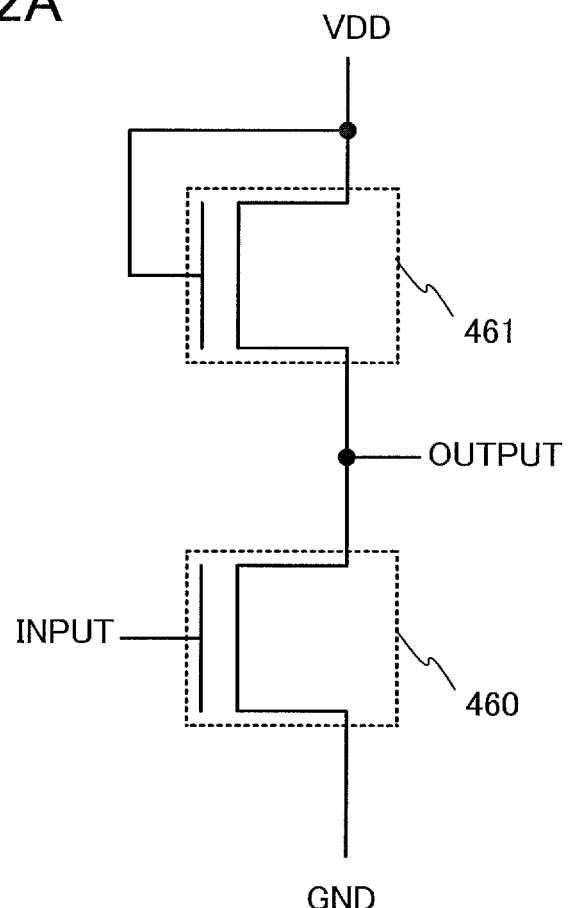
FIGS. 2A and 2B illustrate a semiconductor device.

Although the example of the EDMOS circuit is described in Embodiment 1, an equivalent circuit of an EEMOS circuit is illustrated in FIG. 2A in this embodiment. In the equivalent circuit illustrated in FIG. 2A, a driver circuit can be formed in either case: a case where a first thin film transistor 460 and a second thin film transistor 461 are both enhancement type n-channel transistors, or a case where the first thin film transistor 460 is an enhancement type n-channel transistor and the second thin film transistor 461 is a depletion n-channel transistor.

Figure 2B:
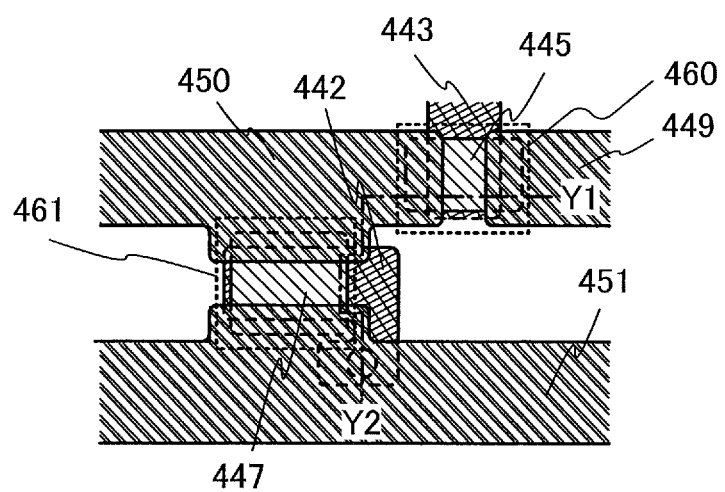

It can be said that it is preferable to use the circuit configuration illustrated in FIG. 2A in which enhancement type n-channel transistors of the same type are combined for the driver circuit. This is because in that case, a transistor used for a pixel portion is also formed of an enhancement type n-channel transistor which is the same type as that used for the driver circuit, and therefore the number of manufacturing steps is not increased. FIG. 2B is a top view. In FIG. 2B, a cross section taken along the chain line Y1-Y2 corresponds to FIG. 2A.

Note that the first thin film transistor 460 and the second thin film transistor 461 which are illustrated in FIGS. 2A and 2B are each an inversed staggered thin film transistor and exemplify a thin film transistor in which a wiring is formed over a semiconductor layer with a source region or a drain region interposed therebetween.

Figure 3A:
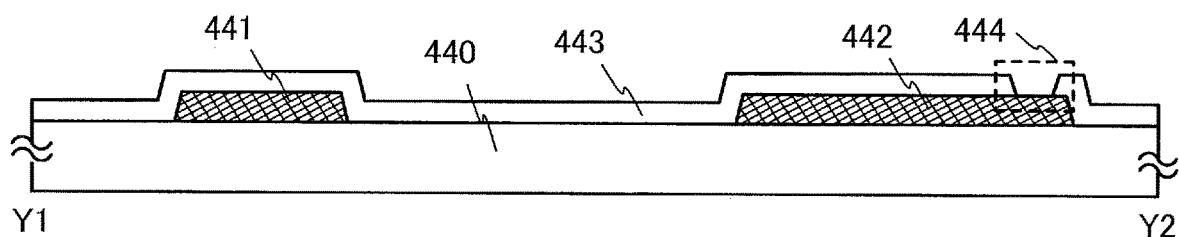
FIGS. 3A to 3C illustrate a method for manufacturing a semiconductor device.
Figure 3B:
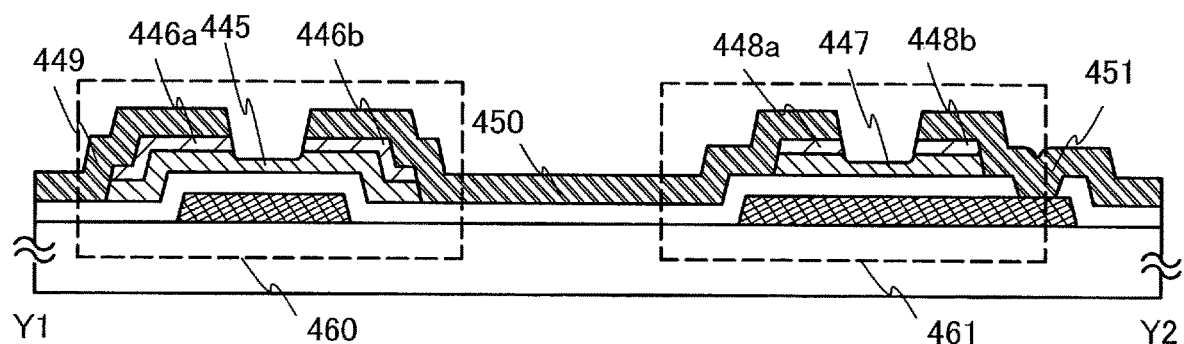
Figure 3C:
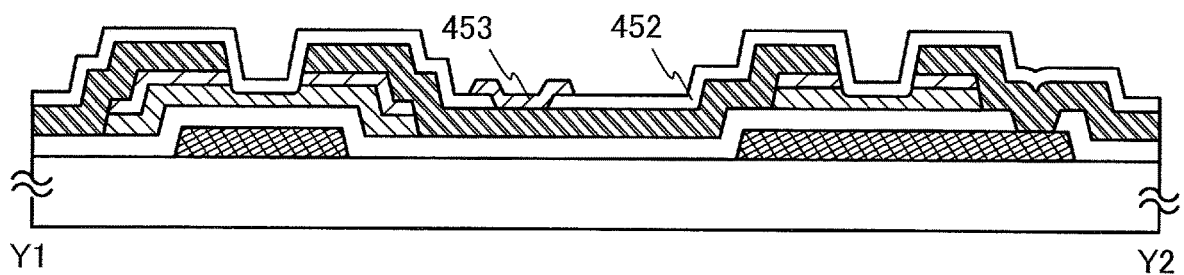

In addition, an example of a manufacturing process of an inverter circuit is illustrated in FIGS. 3A to 3C.

A first conductive film is formed over a substrate 440 by a sputtering method and the first conductive film is etched as selected using a first photomask to form a first gate electrode 441 and a second gate electrode 442. Next, a gate insulating layer 443 for covering the first gate electrode 401 and the second gate electrode 442 is formed by a plasma CVD method or a sputtering method. The gate insulating layer 443 can be formed to have a single layer or a stack of a silicon oxide layer, a silicon nitride layer, a silicon oxynitride layer, or a silicon nitride oxide layer by a CVD method, a sputtering method, or the like. Alternatively, the gate insulating layer 443 can be formed of a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, the gate insulating layer 443 is etched as selected using a second photomask to form a contact hole 444 that reaches the second gate electrode 442. A cross-sectional view of the steps so far corresponds to FIG. 3A.

Next, an oxide semiconductor film is formed by a sputtering method, and an $n^+$-type layer is formed thereover. Note that reverse sputtering in which plasma is generated after introduction of an argon gas is preferably performed to remove dust attached to a surface of the gate insulating layer 443 and the bottom surface of the contact hole 444 before the oxide semiconductor film is formed by a sputtering method. The reverse sputtering refers to a method in which, without application of a voltage to a target side, an RF power source is used for application of a voltage to a substrate side in an argon atmosphere to modify a surface. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Next, the oxide semiconductor film and the $n^+$-type layer are etched as selected using a third photomask. Then, a second conductive film is formed by a sputtering method and the second conductive film is etched as selected using a fourth photomask to form a first wiring 449, a second wiring 450, and a third wiring 451. The third wiring 451 is directly in contact with the second gate electrode 442 through the contact hole 444. Note that reverse sputtering in which plasma is generated after introduction of an argon gas is preferably performed to remove dust attached to a surface of the gate insulating layer 443, a surface of the $n^+$-type layer, and the bottom surface of the contact hole 444 before the second conductive film is formed by a sputtering method. The reverse sputtering refers to a method in which, without application of a voltage to a target side, an RF power source is used for application of a voltage to a substrate side in an argon atmosphere to modify a surface. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Note that in the etching of the second conductive film, parts of the $n^+$-type layers and the oxide semiconductor films are also etched to form $n^+$-type layers 446a, 446b, 448a, and 448b and a first oxide semiconductor layer 445 and a second oxide semiconductor layer 447. This etching reduces the thickness of parts of the first oxide semiconductor layer 445 and the second oxide semiconductor layer 447 so that the parts overlapping with the first and second gate electrodes are thinned. When this etching step is finished, the first thin film transistor 460 and the second thin film transistor 461 are completed. A cross-sectional view of the steps so far corresponds to FIG. 3B.

Next, heat treatment is performed at 200 to 600° C. in an air atmosphere or a nitrogen atmosphere. Note that the timing of this heat treatment is not particularly limited and the heat treatment may be performed anytime as long as it is performed after the formation of the oxide semiconductor film.

Next, a protective layer 452 is formed and the protective layer 452 is etched as selected using a fifth photomask to form a contact hole. After that, a third conductive film is formed. Lastly, the third conductive film is etched as selected using a sixth photomask to form a connection wiring 453 that is electrically connected to the second wiring 410. A cross-sectional view of the steps so far corresponds to FIG. 3C.

In a light-emitting display device in which a light-emitting element is used, a pixel portion has a plurality of thin film transistors, and the pixel portion also has a contact hole for electrically connecting a gate electrode of one thin film transistor to a source wiring or a drain wiring of another transistor. This contact portion can be formed using the same mask as in the step of forming the contact hole in the gate insulating layer using the second photomask.

Further, as for a liquid crystal display device or an electronic paper, in a terminal portion for connection to an external terminal such as an FPC, a contact hole that reaches a gate wiring can be formed using the same mask as in a step of forming a contact hole in a gate insulating layer using the second photomask.

Note that the order of the steps described above is merely an example and there is no limitation to the order. For example, although the number of photomasks increases by one, etching of the second conductive film and etching of parts of the $n^+$-type layers and the oxide semiconductor films may be separately performed using different photomasks.

Embodiment 3

Figure 4A:
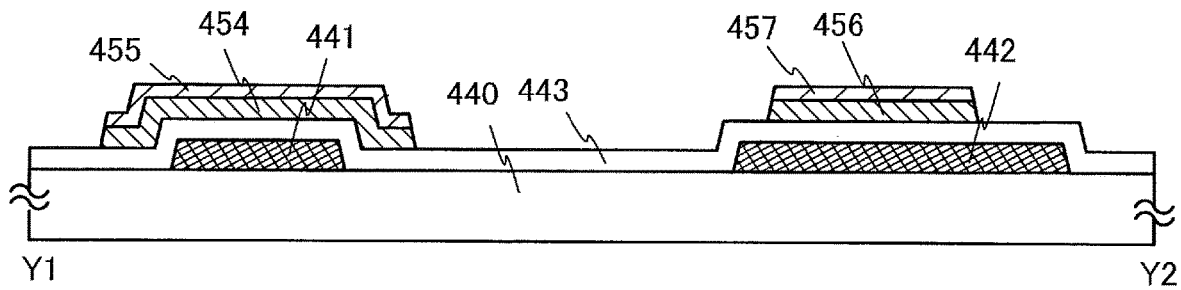
FIGS. 4A to 4D illustrate a method for manufacturing a semiconductor device.
Figure 4B:
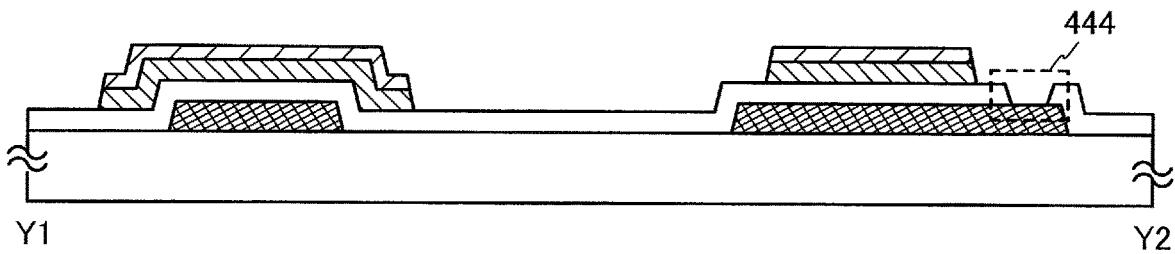

In this embodiment, an example of a manufacturing process of an inverter circuit which is different from the process described in Embodiment 2 will be described using FIGS. 4A to 4C.

A first conductive film is formed over the substrate 440 by a sputtering method and the first conductive film is etched as selected using a first photomask to form the first gate electrode 441 and the second gate electrode 442. Next, the gate insulating layer 443 for covering the first gate electrode 441 and the second gate electrode 442 is formed by a plasma CVD method or a sputtering method.

Next, an oxide semiconductor film is formed by a sputtering method, and an $n^+$-type layer is formed thereover.

Next, the oxide semiconductor film and the $n^+$-type layer are etched as selected using the second photomask. Thus, an oxide semiconductor film 454 and an $n^+$-type layer 455 are formed which are overlapped with the first gate electrode 441 with the gate insulating layer 443 interposed therebetween. In addition, an oxide semiconductor film 456 and an $n^+$-type layer 457 are formed which are overlapped with the second gate electrode 442 with the gate insulating layer 443 interposed therebetween. A cross-sectional view of the steps so far is illustrated in FIG. 4A.

Next, the gate insulating layer 443 is etched as selected using a third photomask to form the contact hole 444 that reaches the second gate electrode 442. A cross-sectional view of the steps so far corresponds to FIG. 4B.

Next, the second conductive film is formed by a sputtering method and etched as selected using a fourth photomask to form the first wiring 449, the second wiring 450, and the third wiring 451. Note that reverse sputtering in which plasma is generated after introduction of an argon gas is preferably performed to remove dust attached to a surface of the gate insulating layer 443, a surface of the n$^+$-type layers 455 and 457, and the bottom surface of the contact hole 444 before the second conductive film is formed by a sputtering method. The reverse sputtering refers to a method in which, without application of a voltage to a target side, an RF power source is used for application of a voltage to a substrate side in an argon atmosphere to modify a surface. Note that nitrogen, helium, or the like may be used instead of an argon atmosphere. Alternatively, the reverse sputtering may be performed in an argon atmosphere to which oxygen, hydrogen, N$_2$O, or the like is added. Further alternatively, the reverse sputtering may be performed in an argon atmosphere to which Cl$_2$, CF$_4$, or the like is added.

In the process of this embodiment, since the second conductive film can be formed without formation of any other film after the contact hole 444 is formed, the number of steps involving exposure of the bottom surface of the contact hole is smaller than that in Embodiment 2; therefore, a material for the gate electrode can be chosen from a wider range. In Embodiment 2, since the oxide semiconductor film is formed in contact with the gate electrode surface exposed in the contact hole 444, etching conditions or a material of the gate electrode should be selected so that the material of the gate electrode is not etched through the step of etching the oxide semiconductor film.

Note that in the etching of the second conductive film, parts of the n$^+$-type layers and the oxide semiconductor films are also etched to form the n$^+$-type layers 446a, 446b, 448a, and 448b and the first oxide semiconductor layer 445 and the second oxide semiconductor layer 447. This etching reduces the thickness of parts of the first oxide semiconductor layer 445 and the second oxide semiconductor layer 447 so that the parts overlapping with the first and second gate electrodes are thinned. When this etching step is finished, the first thin film transistor 460 and the second thin film transistor 461 are completed.

The first thin film transistor 460 includes the first gate electrode 441 and the first oxide semiconductor layer 445 overlapped with the first gate electrode 441 with the gate insulating layer 443 interposed therebetween, and the first wiring 449 is a power supply line at a ground potential (a ground power supply line). This power supply line at a ground potential may be a power supply line to which a negative voltage VDL is applied (a negative power supply line).

In addition, the second thin film transistor 461 includes the second gate electrode 442 and the second oxide semiconductor layer 447 overlapped with the second gate electrode 442 with the gate insulating layer 443 interposed therebetween. The third wiring 451 is a power supply line to which a positive voltage VDD is applied (a positive power supply line).

The n$^+$-type layer 446a is provided between the first oxide semiconductor layer 445 and the first wiring 449, and the n$^+$-type layer 446b is provided between the first oxide semiconductor layer 445 and the second wiring 450. Further, the n$^+$-type layer 448a is provided between the second oxide semiconductor layer 447 and the second wiring 450, and the n$^+$-type layer 448b is provided between the second oxide semiconductor layer 447 and the third wiring 451.

Figure 4C:
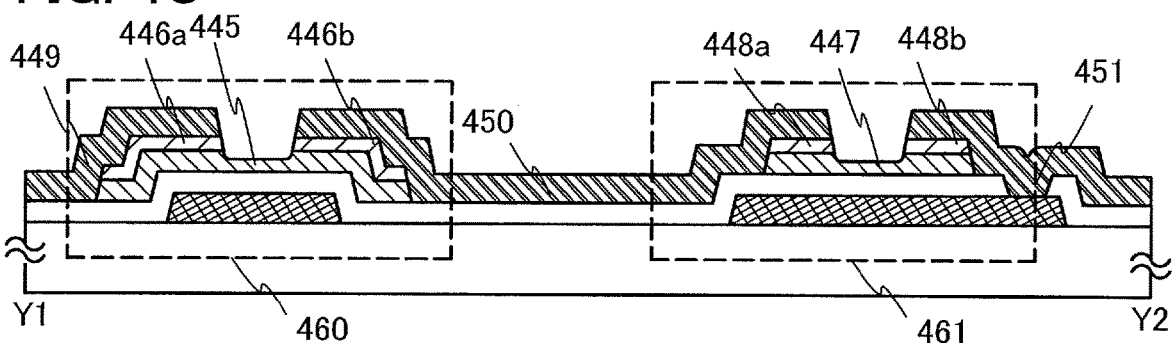
Figure 4D:
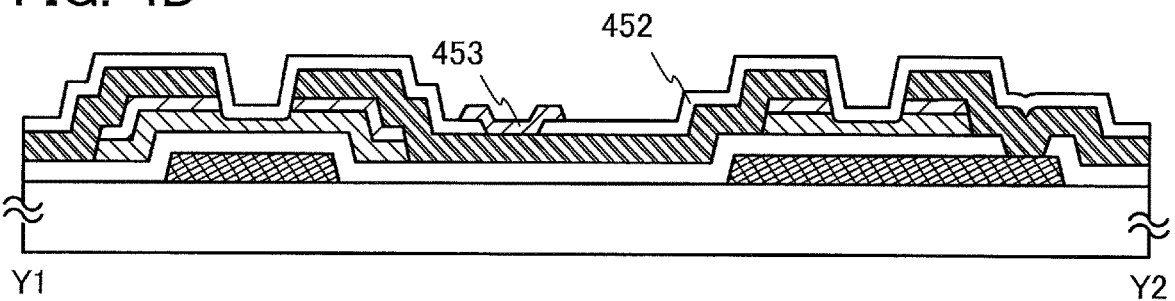
Figure 7:
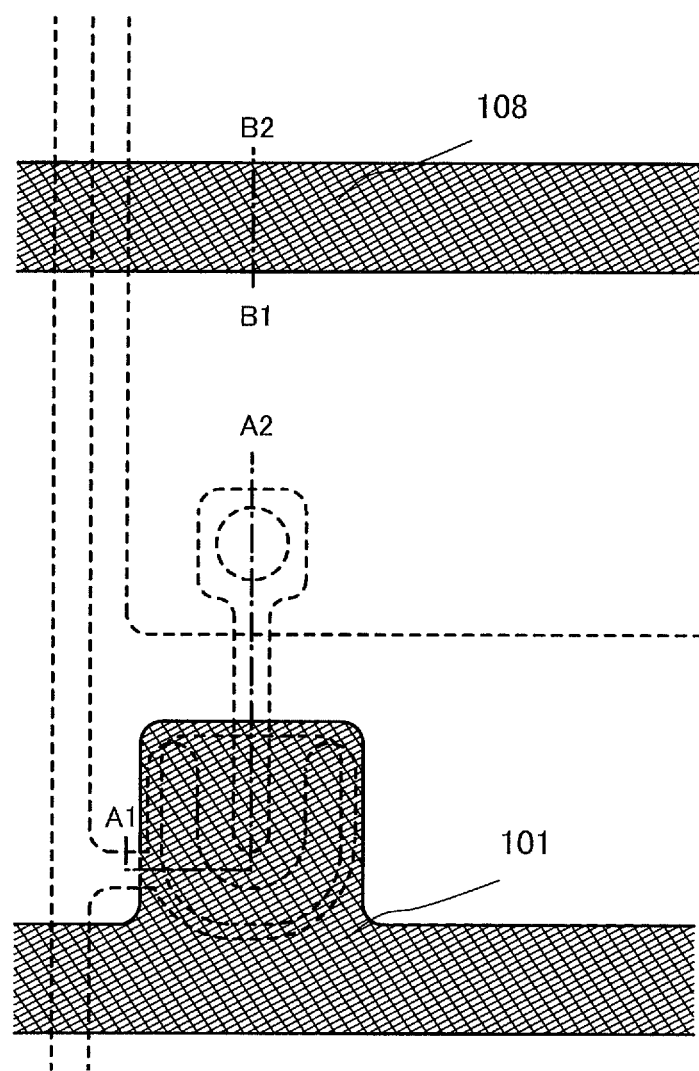
FIG. 7 illustrates a method for manufacturing a semiconductor device.
Figure 8:
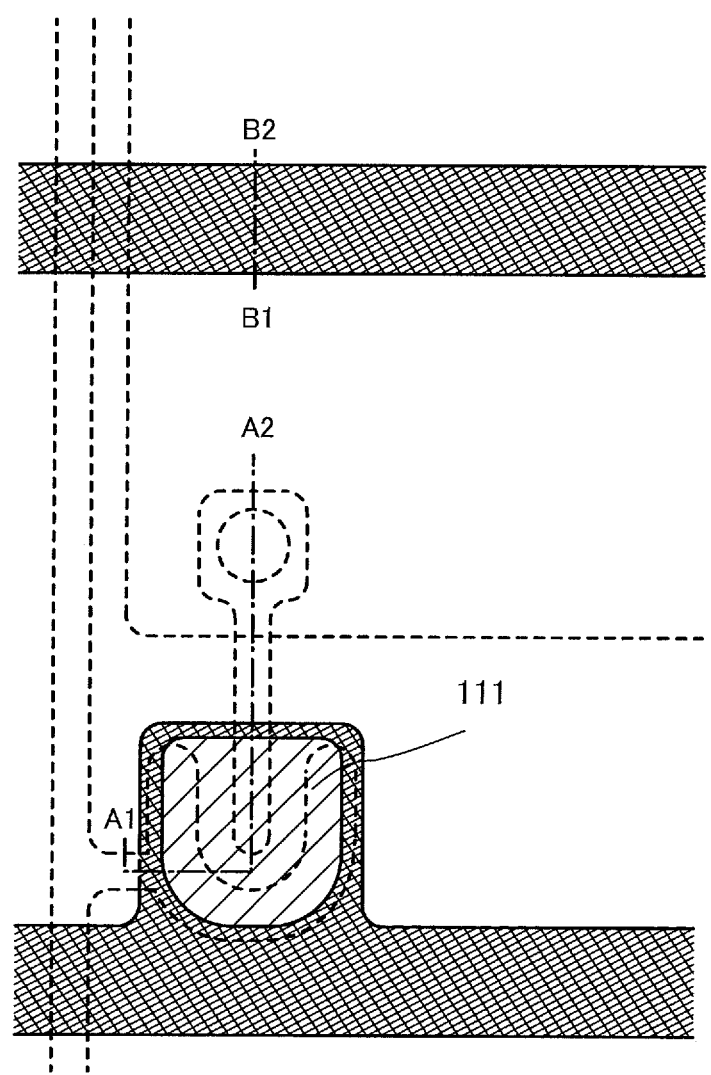
FIG. 8 illustrates a method for manufacturing a semiconductor device.

A cross-sectional view of the steps so far corresponds to FIG. 4C.

Next, heat treatment is performed at 200 to 600° C. in an air atmosphere or a nitrogen atmosphere. Note that the timing of this heat treatment is not particularly limited and the heat treatment may be performed anytime as long as it is performed after the formation of the oxide semiconductor film.

Next, the protective layer 452 is formed and the protective layer 452 is etched as selected using a fifth photomask to form a contact hole. After that, a third conductive film is formed. Lastly, the third conductive film is etched as selected using a sixth photomask to form the connection wiring 453 that is electrically connected to the second wiring 450.

In a light-emitting display device in which a light-emitting element is used, a pixel portion has a plurality of thin film transistors, and the pixel portion also has a contact hole for electrically connecting a gate electrode of one thin film transistor to a source wiring or a drain wiring of another transistor. This contact portion can be formed using the same mask as in the step of forming the contact hole in the gate insulating layer using the third photomask.

Further, as for a liquid crystal display device or an electronic paper, in a terminal portion for connection to an external terminal such as an FPC, a contact hole that reaches a gate wiring can be formed using the same mask as in a step of forming a contact hole in a gate insulating layer using the third photomask.

Note that the order of the steps described above is merely an example and there is no limitation to the order. For example, although the number of photomasks increases by one, etching of the second conductive film and etching of parts of the n$^+$-type layers and the oxide semiconductor films may be separately performed using different photomasks.

Embodiment 4

In this embodiment, a manufacturing process of a display device including a thin film transistor according to an embodiment of the present invention will be described using FIGS. 5A to 5C, FIGS. 6A to 6C, FIG. 7, FIG. 8, FIG. 9, FIG. 10, FIGS. 11A1 to 11B2, and FIG. 12.

In FIG. 5A, as a substrate 100 having a light-transmitting property, a glass substrate of barium borosilicate glass, aluminoborosilicate glass, or the like typified by #7059 glass, #1737 glass, or the like manufactured by Corning, Inc. can be used.

Next, a conductive layer is formed over the entire surface of the substrate 100. After that, a first photolithography step is performed to form a resist mask, and unnecessary portions are removed by etching, thereby forming wirings and an electrode (a gate wiring including a gate electrode layer 101, a capacitor wiring 108, and a first terminal 121). At this time, the etching is performed so that at least end portions of the gate electrode layer 101 have a tapered shape. A cross-sectional view at this stage is illustrated in FIG. 5A. Note that a top view at this stage corresponds to FIG. 7.

The gate wiring including the gate electrode layer 101, the capacitor wiring 108, and the first terminal 121 of a terminal portion are preferably formed from a conductive material having low resistance, such as aluminum (Al) or copper (Cu). However, since use of Al alone brings disadvantages such as low resistance and a tendency to be corroded, aluminum is used in combination with a conductive material having heat resistance. As the conductive material having heat resistance, any of the following materials may be used: an element selected from titanium (Ti), tantalum (Ta), tungsten (W), molybdenum (Mo), chromium (Cr), and neodymium (Nd), scandium (Sc), an alloy containing any of these elements as a component, an alloy containing any of these elements in combination, and a nitride containing any of these elements as a component.

Next, a gate insulating layer 102 is formed over the entire surface of the gate electrode layer 101. The gate insulating layer 102 is formed to a thickness of 50 to 250 nm by a sputtering method or the like.

For example, for the gate insulating layer 102, a 100-nm-thick silicon oxide film is formed by a sputtering method. Needless to say, the gate insulating layer 102 is not limited to such a film and may be a single layer or a stack of any other types of insulating films such as a silicon oxynitride film, a silicon nitride film, an aluminum oxide film, and a tantalum oxide film.

Note that reverse sputtering in which plasma is generated after introduction of an argon gas is preferably performed to remove dust attached to a surface of the gate insulating layer before the oxide semiconductor film is formed. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Next, a first oxide semiconductor film (in this embodiment, a first In—Ga—Zn—O-based non-single-crystal film) is formed over the gate insulating layer 102. Formation of the first In—Ga—Zn—O-based non-single-crystal film without exposure to air after the plasma treatment is effective in preventing dust and moisture from attaching to the interface between the gate insulating layer and the semiconductor film. Here, the first In—Ga—Zn—O-based non-single-crystal film is formed in an argon or oxygen atmosphere using an oxide semiconductor target having a diameter of 8 inches and containing In, Ga, and Zn (the ratio of $In_2O_3$ to $Ga_2O_3$ and ZnO is 1:1:1), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The first In—Ga—Zn—O-based non-single-crystal film has a thickness of 5 to 200 nm. In this embodiment, the thickness of the first In—Ga—Zn—O-based non-single-crystal film is 100 nm.

Next, a second oxide semiconductor film (in this embodiment, a second In—Ga—Zn—O-based non-single-crystal film) is formed by a sputtering method without exposure to air. Here, sputtering is performed using a target in which the ratio of $In_2O_3$ to $Ga_2O_3$ and ZnO is 1:1:1 under deposition conditions where the pressure is 0.4 Pa, the power is 500 W, the deposition temperature is room temperature, and an argon gas is introduced at a flow rate of 40 sccm. Despite the intentional use of the target in which the ratio of $In_2O_3$ to $Ga_2O_3$ and ZnO is 1:1:1, an In—Ga—Zn—O-based non-single-crystal film including crystal grains with a size of 1 to 10 nm immediately after the film formation may be formed. Note that it can be said that the presence or absence of crystal grains or the density of crystal grains can be adjusted and the diameter size can be adjusted within the range of 1 to 10 nm by appropriate adjustment of the composition ratio in the target, the deposition pressure (0.1 to 2.0 Pa), the power (250 to 3000 W: 8 inches ø), the temperature (room temperature to 100° C.), the reactive sputtering conditions for deposition, or the like. The second In—Ga—Zn—O-based non-single-crystal film has a thickness of 5 to 20 nm. Needless to say, when the film includes crystal grains, the size of the crystal grains does not exceed the thickness of the film. In this embodiment, the thickness of the second In—Ga—Zn—O-based non-single-crystal film is 5 nm.

The first In—Ga—Zn—O-based non-single-crystal film is formed under deposition conditions different from deposition conditions for the second In—Ga—Zn—O-based non-single-crystal film. For example, the first In—Ga—Zn—O-based non-single-crystal film is formed under conditions where the ratio of an oxygen gas flow rate to an argon gas flow rate is higher than the ratio of an oxygen gas flow rate to an argon gas flow rate under the deposition conditions for the second In—Ga—Zn—O-based non-single-crystal film. Specifically, the second In—Ga—Zn—O-based non-single-crystal film is formed in a rare gas (e.g., argon or helium) atmosphere (or an atmosphere, less than or equal to 10% of which is an oxygen gas and greater than or equal to 90% of which is an argon gas), and the first In—Ga—Zn—O-based non-single-crystal film is formed in an oxygen atmosphere (or an atmosphere in which the ratio of an argon gas flow rate to an oxygen gas flow rate is 1:1 or more).

A chamber used for deposition of the second In—Ga—Zn—O-based non-single-crystal film may be the same or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin film of a compound thereof, and a bias sputtering in which a voltage is also applied to a substrate during deposition.

Next, a second photolithography step is performed to form a resist mask, and the first In—Ga—Zn—O-based non-single-crystal film and the second In—Ga—Zn—O-based non-single-crystal film are etched. Here, by wet etching using ITO-07N (manufactured by KANTO CHEMICAL CO., INC.), unnecessary portions are removed by etching, thereby forming an oxide semiconductor film 109 which is a first In—Ga—Zn—O-based non-single-crystal film and an oxide semiconductor film 111 which is a second In—Ga—Zn—O-based non-single-crystal film. Note that etching here is not limited to wet etching and may be dry etching. A cross-sectional view at this stage is illustrated in FIG. 5B. Note that a top view at this stage corresponds to FIG. 8.

Next, a third photolithography step is performed to form a resist mask, and unnecessary portions are removed by etching, thereby forming a contact hole reaching the wiring or the electrode layer which are formed from the same material as the gate electrode layer. This contact hole is provided for direct contact with the conductive film formed later. For example, a contact hole is formed when a thin film transistor whose gate electrode layer is in direct contact with the source or drain electrode layer is formed in the driving circuit, or when a terminal that is electrically connected to a gate wiring of a terminal portion is formed.

Next, over the oxide semiconductor film 109 and the oxide semiconductor film 111, a conductive film 132 formed from a metal material is formed by a sputtering method or a vacuum evaporation method. FIG. 5C is a cross-sectional view at this stage.

As the material of the conductive film 132, there are an element selected from Al, Cr, Ta, Ti, Mo, and W, an alloy containing any of these elements as a component, an alloy containing these elements in combination, and the like. Further, for heat treatment at 200 to 600° C., the conductive film preferably has heat resistance for such heat treatment. Since use of Al alone brings disadvantages such as low resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), and neodymium (Nd), scandium (Sc), an alloy containing any of these elements as a component, an alloy containing these elements in combination, and a nitride containing any of these elements as a component.

Here, the conductive film 132 has a single-layer structure of a titanium film. Alternatively, the conductive film 132 may have a two-layer structure: an aluminum film and a titanium film stacked thereon. Still alternatively, the conductive film 132 may have a three-layer structure: a Ti film, an aluminum film containing Nd (Al—Nd) which is stacked on the Ti film, and a Ti film formed on these films. The conductive film 132 may have a single-layer structure of an aluminum film containing silicon.

Figure 9:
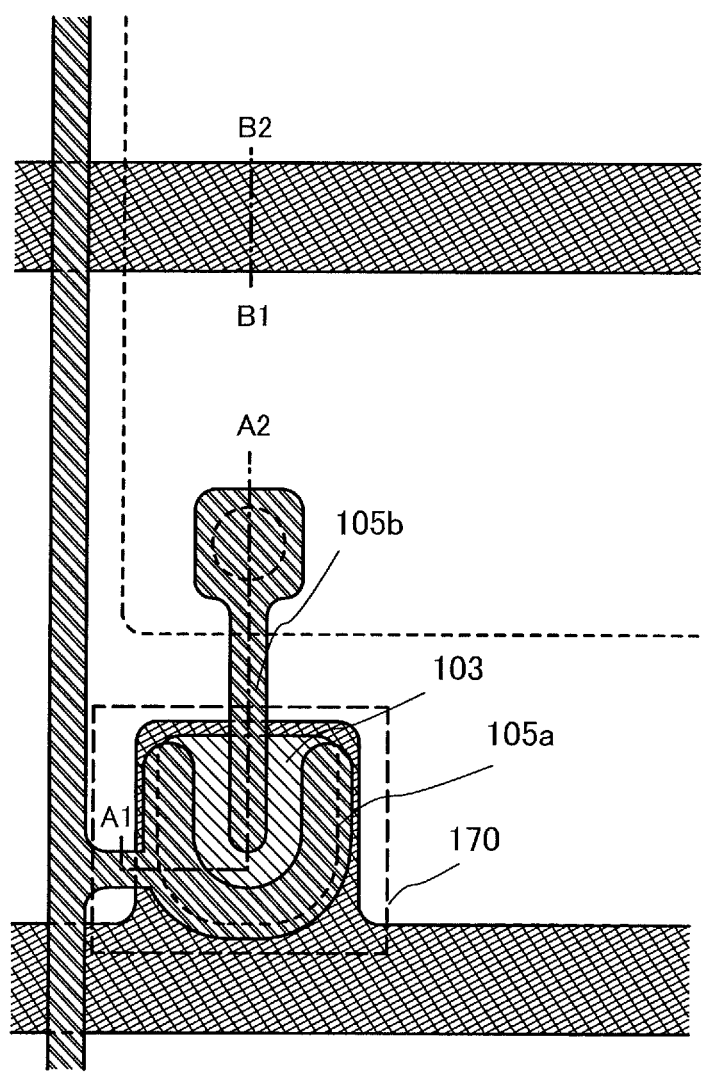
FIG. 9 illustrates a method for manufacturing a semiconductor device.

Next, a resist mask 131 is formed by a fourth photolithography step, and unnecessary portions are removed by etching, thereby forming source and drain electrode layers 105a and 105b, n$^+$-type layers 104a and 104b serving as source or drain regions and a connection electrode 120. Wet etching or dry etching is used as an etching method at this time. For example, when an aluminum film or an aluminum-alloy film is used as the conductive film 132, wet etching using a mixed solution of phosphoric acid, acetic acid, and nitric acid can be carried out. Here, by wet etching using an ammonia hydrogen peroxide mixture (with the ratio of hydrogen peroxide to ammonia and water being 5:2:2), the conductive film 132 of a Ti film is etched to form the source and drain electrode layers 105a and 105b, and the oxide semiconductor film 111 is etched to form the n$^+$-type layers 104a and 104b. In this etching step, an exposed region of the oxide semiconductor film 109 is partly etched to be a semiconductor layer 103. Thus, a channel region of the semiconductor layer 103 has a small thickness. The etching for forming the source and drain electrode layers 105a and 105b and the n$^+$-type layers 104a and 104b is performed at a time using an etchant of an ammonia hydrogen peroxide mixture. Accordingly, in FIG. 6A, an end portion of the source and drain electrode layer 105a and an end portion of the source or drain electrode layer 105b are aligned with an end portion of the n$^+$-type layer 104a and an end portion of the n$^+$-type layer 104b, respectively; thus, continuous end portions are formed. In addition, wet etching etches the layers isotropically, so that the end portions of the source and drain electrode layers 105a and 105b are recessed from the resist mask 131. Through the aforementioned steps, a thin film transistor 170 which includes the semiconductor layer 103 as a channel formation region can be manufactured. A cross-sectional view at this stage is illustrated in FIG. 6A. Note that FIG. 9 is a top view at this stage.

Next, heat treatment is preferably performed at 200 to 600° C., typically, 300 to 500° C. Here, heat treatment is performed in a nitrogen atmosphere in a furnace at 350° C. for 1 hour. Through this heat treatment, rearrangement at the atomic level occurs in the In—Ga—Zn—O-based non-single-crystal film. Because strain energy which inhibits carrier movement is released by the heat treatment, the heat treatment (including optical annealing) is important. Note that there is no particular limitation on the timing of heat treatment as long as it is performed after formation of the second In—Ga—Zn—O-based non-single-crystal film, and for example, heat treatment may be performed after formation of a pixel electrode.

Furthermore, the exposed channel formation region of the semiconductor layer 103 may be subjected to oxygen radical treatment, so that a normally-off thin film transistor can be obtained. In addition, the radical treatment can repair damage due to the etching of the semiconductor layer 103. The radical treatment is preferably performed in an atmosphere of $O_2$ or $N_2O$, and preferably an atmosphere of $N_2$, He, or Ar each containing oxygen. The radical treatment may also be performed in an atmosphere in which $Cl_2$ or $CF_4$ is added to the above atmosphere. Note that the radical treatment is preferably performed with no bias applied.

In the fourth photolithography step, a second terminal 122 made from the same material as the source and drain electrode layers 105a and 105b is also left in the terminal portion. Note that the second terminal 122 is electrically connected to a source wiring (a source wiring including the source or drain electrode layers 105a and 105b).

In addition, in the terminal portion, the connection electrode 120 is directly connected to the first terminal 121 of the terminal portion through a contact hole formed in the gate insulating film. Note that although not illustrated here, a source or drain wiring of the thin film transistor of the driver circuit is directly connected to the gate electrode through the same steps as the above steps.

Further, by use of a resist mask having regions with plural thicknesses (typically, two different thicknesses) which is formed using a multi-tone mask, the number of resist masks can be reduced, resulting in simplified process and lower costs.

Next, the resist mask 131 is removed, and a protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Then, a fifth photolithography step is performed to form a resist mask, and the protective insulating layer 107 is etched to form a contact hole 125 which reaches the source or drain electrode layers 105a or 105b. In addition, by the etching here, a contact hole 127 which reaches the second terminal 122 and a contact hole 126 which reaches the connection electrode 120 are formed. A cross-sectional view at this stage is illustrated in FIG. 6B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a sixth photolithography step is performed to form a resist mask, and unnecessary portions are removed by etching, thereby forming a pixel electrode layer 110.

Further, in this sixth photolithography step, a storage capacitor is formed with the capacitor wiring 108 and the pixel electrode layer 110. The storage capacitor includes the gate insulating layer 102 and the protective insulating layer 107 in the capacitor portion as dielectrics.

In addition, in this sixth photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which serves as an input terminal for the gate wiring. The transparent conductive film 129 formed over the second terminal 122 serves as a terminal electrode for connection which serves as an input terminal for the source wiring.

Then, the resist mask is removed, and a cross-sectional view at this stage is illustrated in FIG. 6C. Note that a top view at this stage corresponds to FIG. 10.

Further, FIGS. 11A1 and 11A2 are a cross-sectional view of a gate wiring terminal portion at this stage and a top view thereof, respectively. FIG. 11A1 is a cross-sectional view taken along the line C1-C2 of FIG. 11A2. In FIG. 11A1, a transparent conductive film 155 formed over a protective insulating film 154 is a connection terminal electrode which functions as an input terminal. Furthermore, in FIG. 11A1, in the terminal portion, a first terminal 151 formed from the same material as the gate wiring and a connection electrode 153 formed from the same material as the source wiring overlap with each other and are in direct contact and electrically connected through a contact hole provided in a gate insulating layer 152. In addition, the connection electrode 153 and the transparent conductive film 155 are in direct contact and electrically connected with each other through a contact hole provided in the protective insulating film 154.

Further, FIGS. 11B1 and 11B2 are a cross-sectional view of a source wiring terminal portion at this stage and a top view thereof, respectively. In addition, FIG. 11B1 corresponds to a cross-sectional view taken along the line D1-D2 in FIG. 11B2. In FIG. 11B1, the transparent conductive film 155 formed over the protective insulating film 154 is a connection terminal electrode which functions as an input terminal. Furthermore, in FIG. 11B1, in the terminal portion, an electrode 156 formed from the same material as the gate wiring is located below and overlapped with a second terminal 150, which is electrically connected to the source wiring, with the gate insulating layer 152 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of terminals, and the number of terminals may be determined by a practitioner as appropriate.

Through these six photolithography steps, a pixel thin film transistor portion including the thin film transistor 170, which is a bottom-gate n-channel thin film transistor, and the storage capacitor can be completed using the six photomasks. When these pixel thin film transistor portion and storage capacitor are arranged in a matrix corresponding to respective pixels, a pixel portion can be formed and one of the boards for manufacturing an active matrix display device can be obtained. In this specification, such a board is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 10:
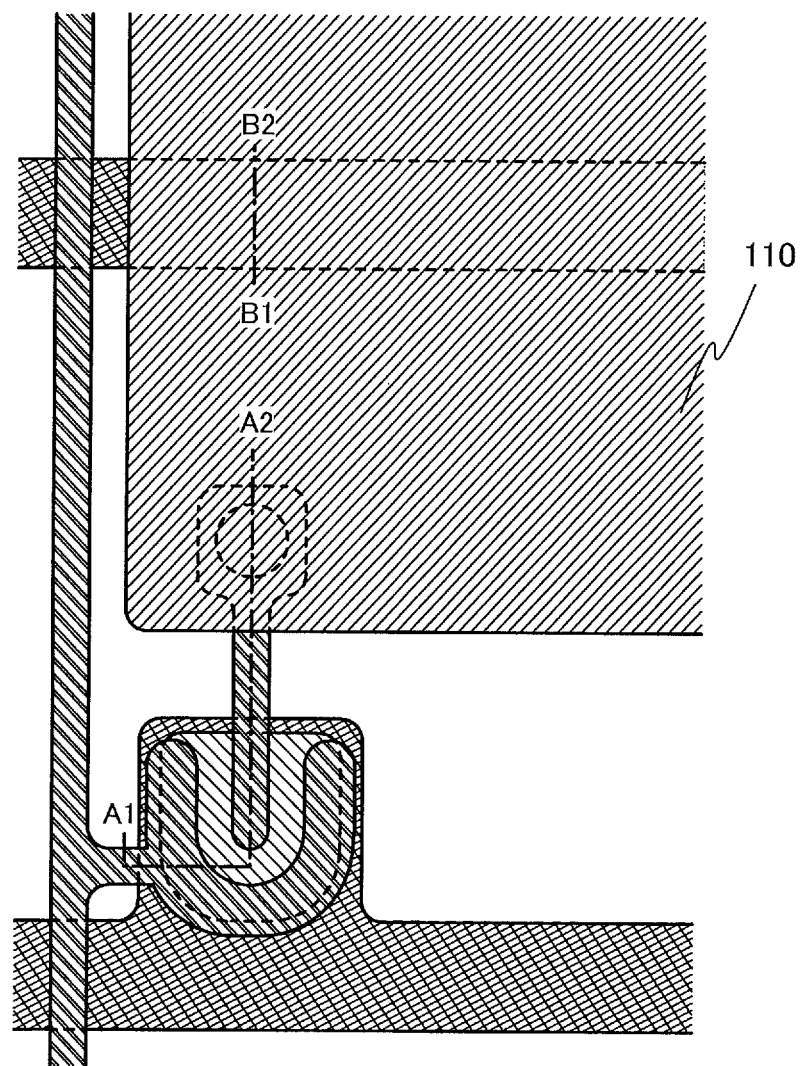
FIG. 10 illustrates a semiconductor device.
Figure 12:
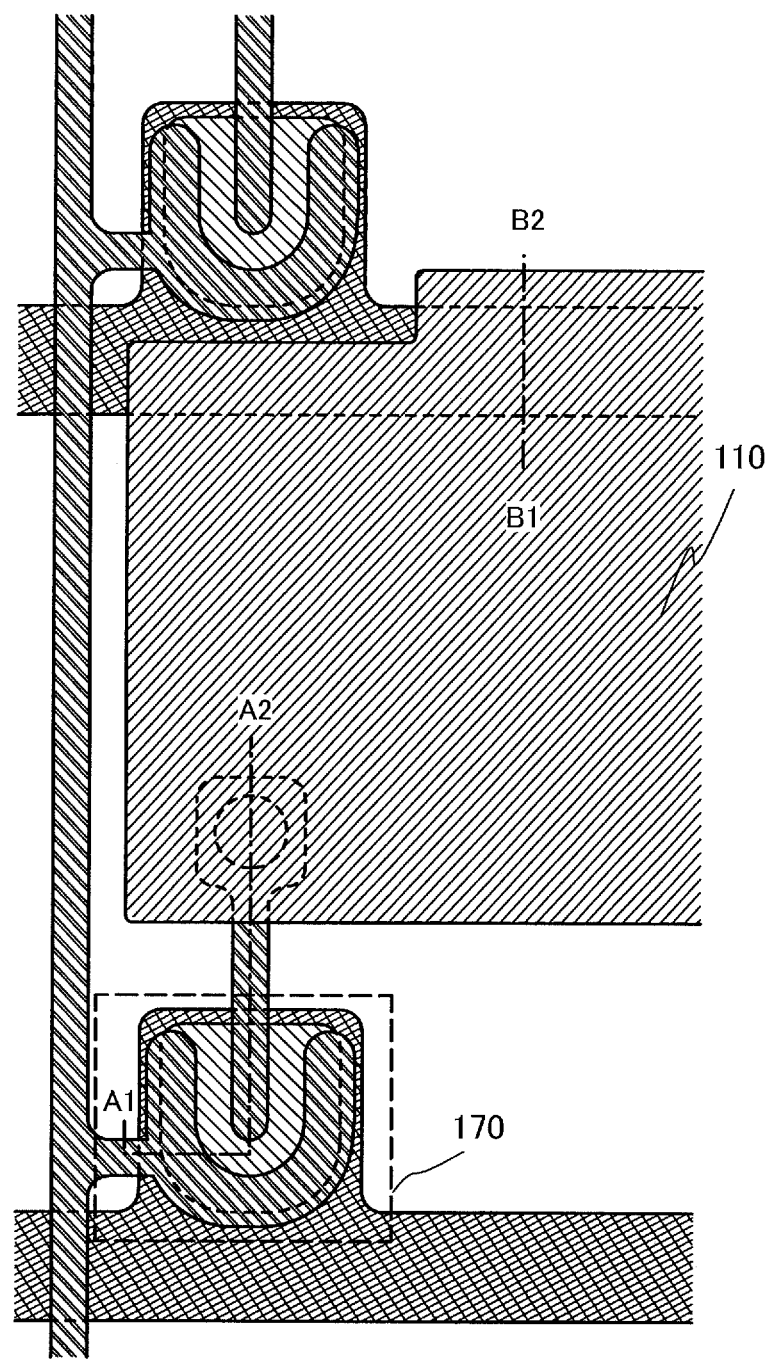
FIG. 12 illustrates a semiconductor device.

Further, an embodiment of the present invention is not limited to a pixel structure in FIG. 10, and an example of a top view different from FIG. 10 is illustrated in FIG. 12. FIG. 12 illustrates an example in which a capacitor wiring is not provided and a storage capacitor is formed with a pixel electrode and a gate wiring of an adjacent pixel which are overlapped with each other with a protective insulating film and a gate insulating layer interposed therebetween. In this case, the capacitor wiring and the third terminal connected to the capacitor wiring can be omitted. Note that in FIG. 12, portions similar to those in FIG. 10 are denoted by the same reference numerals.

In an active matrix liquid crystal display device, pixel electrodes arranged in a matrix are driven to form a display pattern on a screen. Specifically, a voltage is applied between a selected pixel electrode and a counter electrode corresponding to the selected pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is 1.5 or 2 times as long as usual to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large black part.

By combining these driving methods, the display characteristics of a liquid crystal display device, such as moving-image characteristics, can be improved as compared to those of conventional liquid crystal display devices.

The n-channel transistor obtained in this embodiment includes an In—Ga—Zn—O-based non-single-crystal film in a channel formation region and has good dynamic characteristics. Thus, these driving methods can be applied in combination.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

Thin film transistors in which an oxide semiconductor is used are provided in a gate line driver circuit or a source line driver circuit, whereby manufacturing costs are reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

Therefore, according to an embodiment of the present invention, a display device having high electrical properties and high reliability can be provided at low costs.

Embodiment 5

Here, an example of a display device including a thin film transistor according to Embodiment 1 in which a wiring is in contact with a semiconductor layer will be described with reference to FIG. 30.

Figure 30:
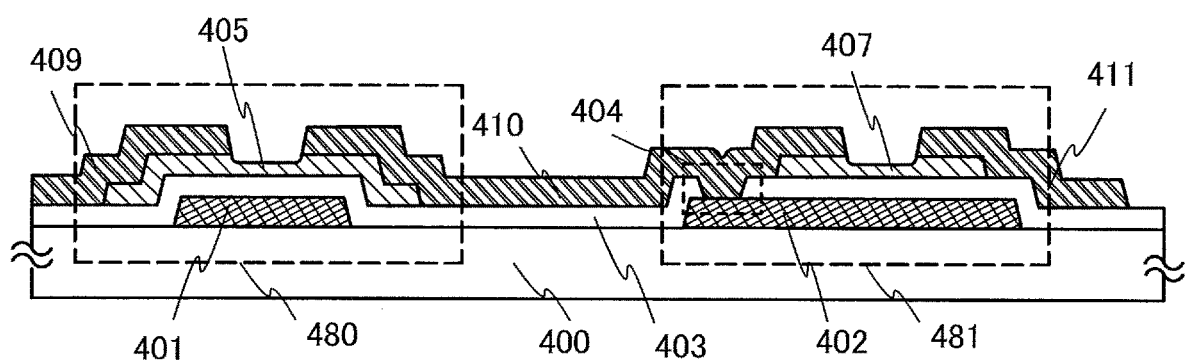
FIG. 30 illustrates a semiconductor device.

FIG. 30 illustrates a cross-sectional structure of an inverter circuit of a driver circuit. Note that a first thin film transistor 480 and a second thin film transistor 481 which are illustrated in FIG. 30 are each an inverted staggered thin film transistor. The first wiring 409, and the second wiring 410 are provided in contact with the first oxide semiconductor layer 405, and the second wiring 410, and the third wiring 411 are provided in contact with the second oxide semiconductor layer 407.

In the first thin film transistor 480 and the second thin film transistor 481, the following regions are preferably modified by plasma treatment: a region where the first oxide semiconductor layer 405 is in contact with the first wiring 409, a region where the first oxide semiconductor layer 405 is in contact with the second wiring 410, a region where the second oxide semiconductor layer 407 is in contact with the second wiring 410, and a region where the second oxide semiconductor layer 407 is in contact with the third wiring 411. In this embodiment, before a conductive film serving as wirings is formed, an oxide semiconductor layer (in this embodiment, an In—Ga—Zn—O-based non-single-crystal film) is subjected to plasma treatment in an argon atmosphere.

For the plasma treatment, instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

In this embodiment, the first wiring 409, the second wiring 410, and the third wiring 411 are made of a titanium film, and subjected to wet etching using an ammonia hydrogen peroxide mixture (with the ratio of hydrogen peroxide to ammonia and water being 5:2:2). In this etching step, exposed regions of the semiconductor layer which is In—Ga—Zn—O-based non-single-crystal film, are partly etched to be the first oxide semiconductor layer 405 and the second oxide semiconductor layer 407. Thus, a channel region of the first semiconductor layer 405 between the first wiring 409 and the second wiring 410 has a small thickness. Similarly, a channel region of the second semiconductor layer 407 between the second wiring 410 and the third wiring 411 has a small thickness.

The conductive film is formed in contact with the first oxide semiconductor layer 405 and the second oxide semiconductor layer 407 which are modified by the plasma treatment; thus, the first wiring 409, the second wiring 410, and the third wiring 411 are formed. It is possible to reduce the contact resistance between the first oxide semiconductor layer 405 and the first wiring 409, the contact resistance between the first oxide semiconductor layer 405 and the second wiring 410, the contact resistance between the second oxide semiconductor layer 407 and the second wiring 410, and the contact resistance between the second oxide semiconductor layer 407 and the third wiring 411.

Through the above process, a highly reliable display device as a semiconductor device can be manufactured.

This embodiment can be implemented in appropriate combination with any of the structures described in the other embodiments.

Embodiment 6

This embodiment describes a display device which is an example of a semiconductor device according to an embodiment of the present invention. In that display device, at least a part of a driver circuit and a thin film transistor in a pixel portion are formed over one substrate.

The thin film transistor in the pixel portion is formed according to Embodiment 4 or 5. The thin film transistor described in Embodiment 4 or 5 is an n-channel TFT; therefore, part of a driver circuit which can be formed using n-channel TFTs is formed over the same substrate as the thin film transistor in the pixel portion.

Figure 14A:
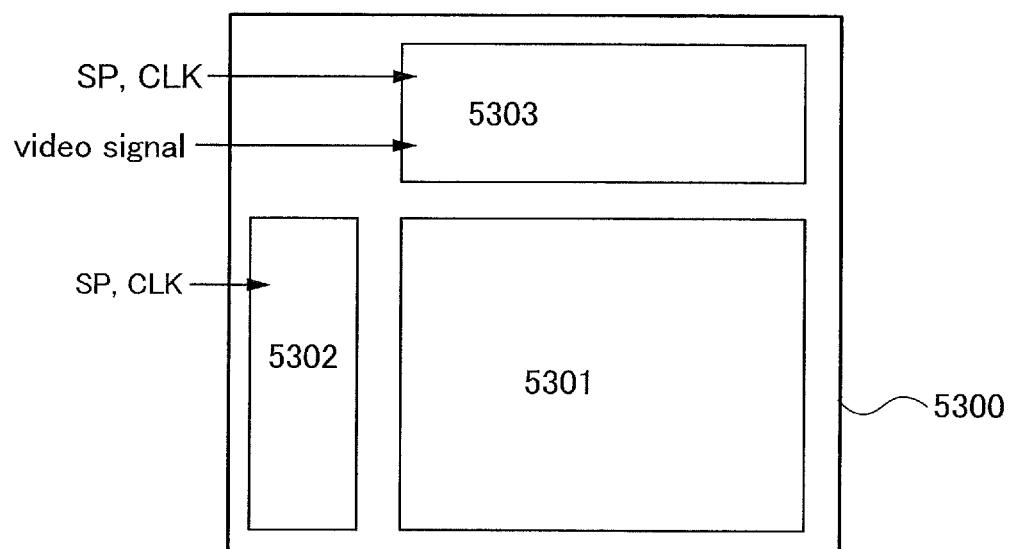
FIGS. 14A and 14B are block diagrams each illustrating a semiconductor device.

FIG. 14A illustrates an example of a block diagram of an active matrix liquid crystal display device which is an example of a semiconductor device according to an embodiment of the present invention. The display device illustrated in FIG. 14A includes, over a substrate 5300, a pixel portion 5301 including a plurality of pixels each provided with a display element; a scan line driver circuit 5302 that selects a pixel; and a signal line driver circuit 5303 that controls a video signal input to the selected pixel.

The pixel portion 5301 is connected to the signal line driver circuit 5303 with a plurality of signal lines S1 to Sm (not shown) extending in a column direction from the signal line driver circuit 5303 and connected to the scan line driver circuit 5302 with a plurality of scan lines G1 to Gn (not shown) extending in a row direction from the scan line driver circuit 5302. The pixel portion 5301 includes a plurality of pixels (not shown) arranged in matrix corresponding to the signal lines Si to Sm and the scan lines G1 to Gn. In addition, each of the pixels is connected to a signal line Sj (any one of the signal lines Si to Sm) and a scan line Gi (any one of the scan lines G1 to Gn).

The thin film transistor described in Embodiment 4 or 5 is an n-channel TFT. A signal line driver circuit including n-channel TFTs is described with reference to FIG. 15.

Figure 15:
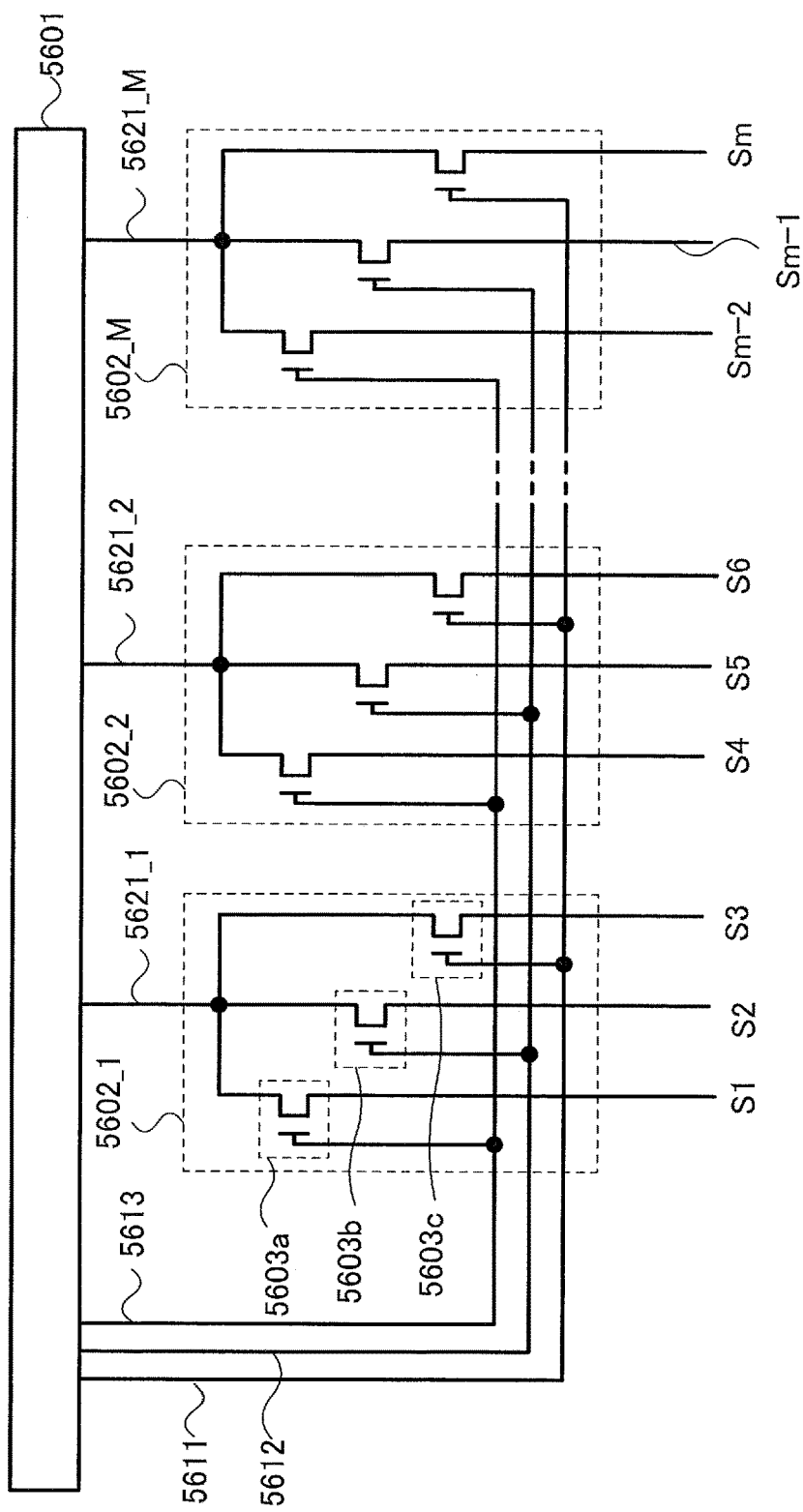
FIG. 15 illustrates a configuration of a signal line driver circuit.

The signal line driver circuit of FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613. In addition, the switch groups 5602_1 to 5602_M are connected to the wirings 5621_1 to 5621_M, respectively. Each of the wirings 5621_1 to 5621_M is connected to three signal lines through the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 through the first thin film transistor 5603a, the second thin film transistor 5603b, and the third thin film transistor 5603c of the switch group 5602_J.

Note that a signal is input to each of the first wiring 5611, the second wiring 5612, and the third wiring 5613.

Note that the driver IC 5601 is preferably formed on a single-crystal substrate. The switch groups 5602_1 to 5602_M are preferably formed over the same substrate as the pixel portion. Therefore, the driver IC 5601 is preferably connected to the switch groups 5602_1 to 5602_M through an FPC or the like.

Figure 16:
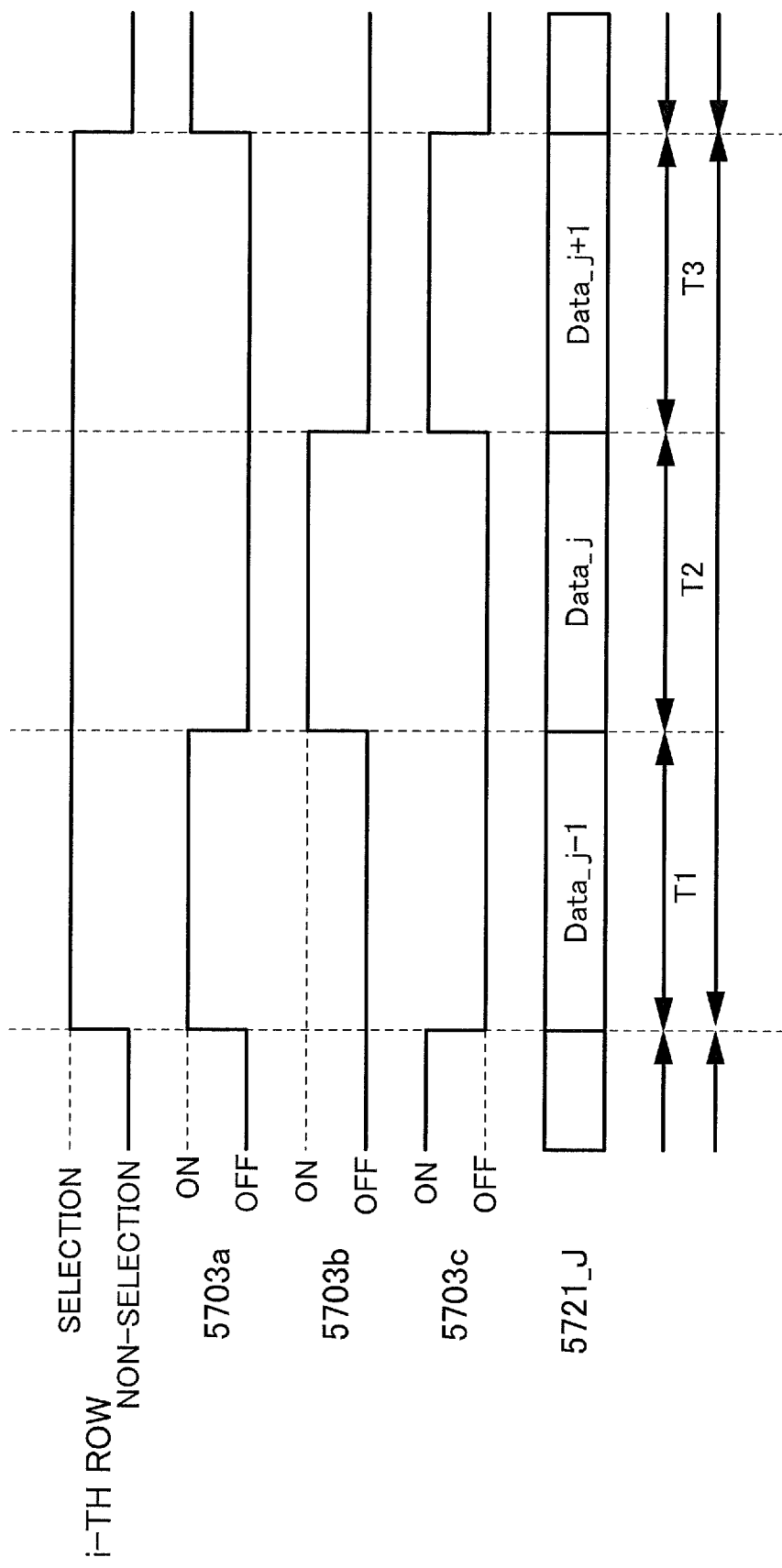
FIG. 16 is a timing chart illustrating operation of a signal line driver circuit.

Next, operation of the signal line driver circuit of FIG. 15 is described with reference to a timing chart of FIG. 16. FIG. 16 illustrates the timing chart where a scan line Gi in the i-th row is selected. A selection period of the scan line Gi in the i-th row is divided into a first sub-selection period T1, a second sub-selection period T2, and a third sub-selection period T3. In addition, the signal line driver circuit of FIG. 15 operates similarly to FIG. 16 when a scan line in another row is selected.

Note that the timing chart of FIG. 16 shows the case where the wiring 5621_J in the J-th column is connected to the signal line Sj−1, the signal line Sj, and the signal line Sj+1 through the first thin film transistor 5603a, the second thin film transistor 5603b, and the third thin film transistor 5603c.

The timing chart of FIG. 16 shows timing when the scan line Gi in the i-th row is selected, timing 5703a when the first thin film transistor 5603a is turned on/off, timing 5703b when the second thin film transistor 5603b is turned on/off, timing 5703c when the third thin film transistor 5603c is turned on/off, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_7 in the first sub-selection period T1 is input to the signal line Sj−1, a video signal input to the wiring 5621_7 in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Data_j−1, Data_j, and Data_j+1, respectively.

As shown in FIG. 16, in the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 through the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj through the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 through the third thin film transistor 5603c.

As described above, in the signal line driver circuit of FIG. 15, one gate selection period is divided into three; thus, video signals can be input to three signal lines from one wiring 5621 in one gate selection period. Therefore, in the signal line driver circuit of FIG. 15, the number of connections between the substrate provided with the driver IC 5601 and the substrate provided with the pixel portion can be reduced to approximately one third the number of signal lines. When the number of connections is reduced to approximately one third the number of signal lines, the reliability, yield, and the like of the signal line driver circuit of FIG. 15 can be improved.

Note that there is no particular limitation on the arrangement, number, driving method, and the like of the thin film transistors, as long as one gate selection period is divided into a plurality of sub-selection periods and video signals are input to a plurality of signal lines from one wiring in the respective sub-selection periods as shown in FIG. 15.

For example, when video signals are input to three or more signal lines from one wiring in the respective sub-selection periods, it is only necessary to add a thin film transistor and a wiring for controlling the thin film transistor. Note that when one gate selection period is divided into four or more sub-selection periods, one sub-selection period becomes short. Therefore, one gate selection period is preferably divided into two or three sub-selection periods.

Figure 17:
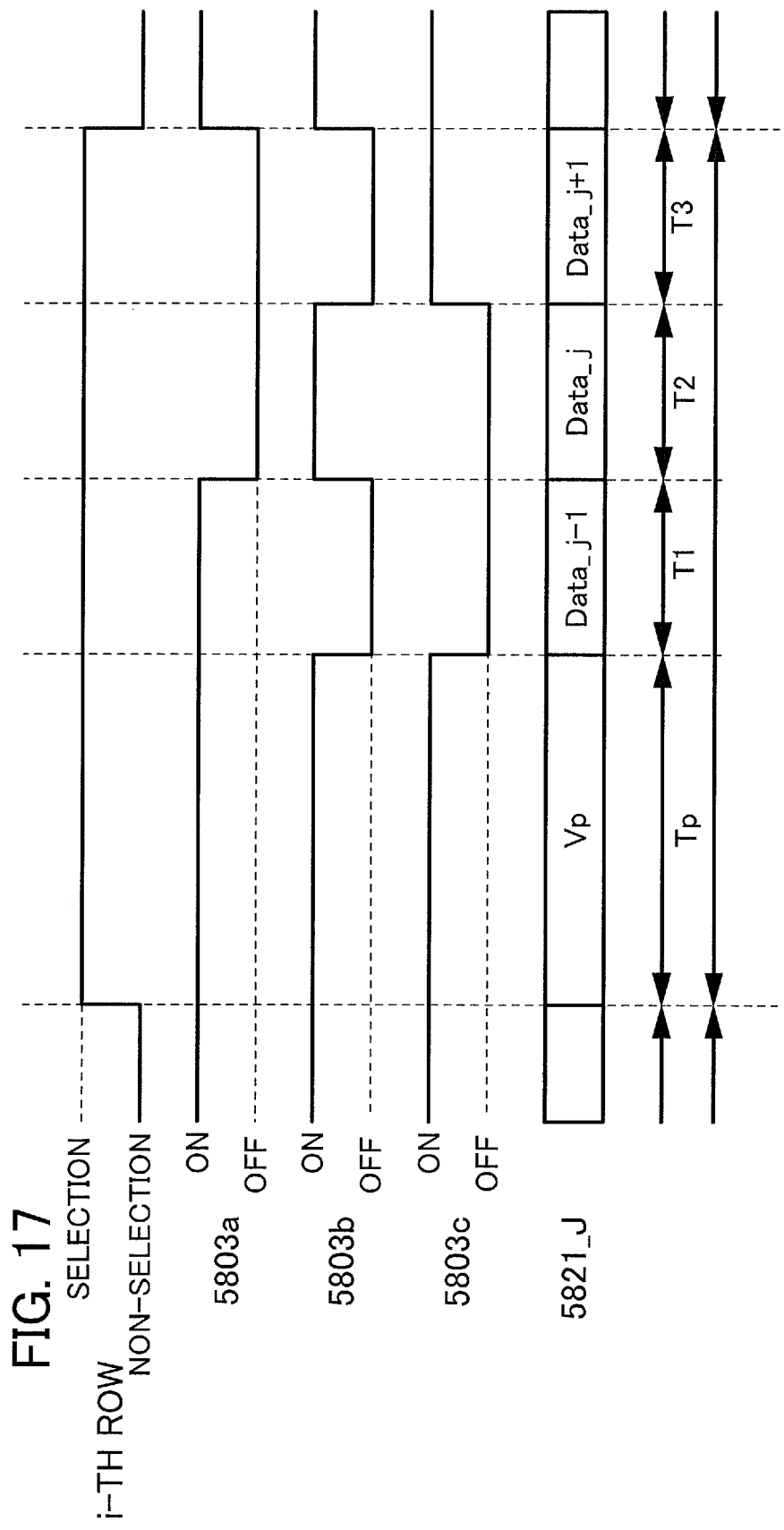
FIG. 17 is a timing chart illustrating operation of a signal line driver circuit.

As another example, as shown in a timing chart of FIG. 17, one selection period may be divided into a precharge period Tp, the first sub-selection period T1, the second sub-selection period T2, and the third sub-selection period T3. The timing chart of FIG. 17 shows timing when the scan line Gi in the i-th row is selected, timing 5803a when the first thin film transistor 5603a is turned on/off, timing 5803b when the second thin film transistor 5603b is turned on/off, timing 5803c when the third thin film transistor 5603c is turned on/off, and a signal 5821_J input to the wiring 5621_J in the J-th column. As shown in FIG. 17, the first thin film transistor 5603a, the second thin film transistor 5603b, and the third thin film transistor 5603c are on in the precharge period Tp. At this time, a precharge voltage Vp input to the wiring 5621_J is input to the signal line Sj−1, the signal line Sj, and the signal line Sj+1 through the first thin film transistor 5603a, the second thin film transistor 5603b, and the third thin film transistor 5603c, respectively. In the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 through the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj through the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 through the third thin film transistor 5603c.

As described above, in the signal line driver circuit of FIG. 15, to which the timing chart of FIG. 17 is applied, the signal line can be precharged by providing the precharge period before the sub-selection periods. Thus, a video signal can be written to a pixel with high speed. Note that portions in FIG. 17 which are similar to those in FIG. 16 are denoted by the same reference numerals, and detailed description of the same portions or portions having similar functions is omitted.

Now, a constitution of the scan line driver circuit is described. The scan line driver circuit includes a shift register and a buffer. Also, the scan line driver circuit may include a level shifter in some cases. In the scan line driver circuit, when a clock signal (CLK) and a start pulse signal (SP) are input to the shift register, a selection signal is produced. The generated selection signal is buffered and amplified by the buffer, and the resulting signal is supplied to a corresponding scan line. Gate electrodes of transistors in pixels in one line are connected to the scan line. Further, since the transistors in the pixels in one line have to be turned on at the same time, a buffer which can feed a large amount of current is used.

An example of a shift register used as part of the scan line driver circuit is described with reference to FIG. 18 and FIG. 19.

Figure 18:
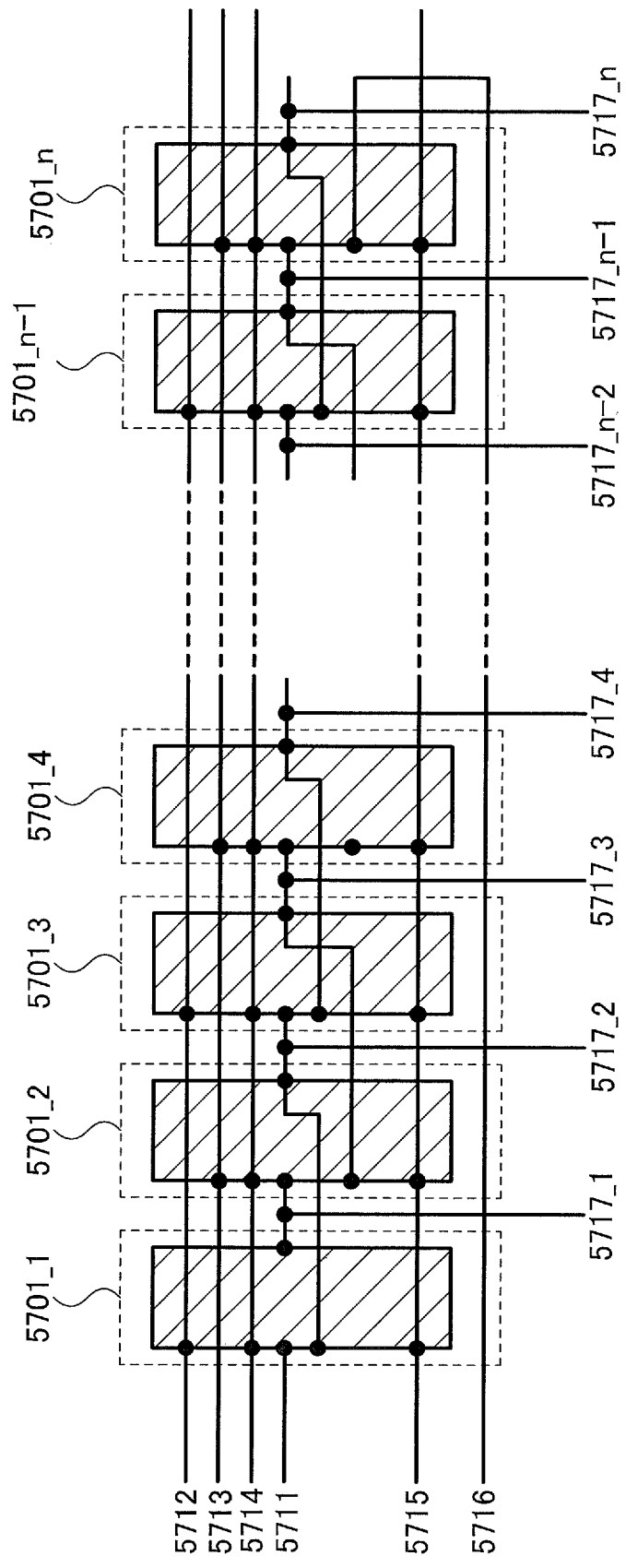
FIG. 18 illustrates a configuration of a shift register.

FIG. 18 illustrates a circuit configuration of the shift register. The shift register shown in FIG. 18 includes a plurality of flip-flops, flip-flops 5701_1 to 5701_n. Further, the shift register operates by input of a first clock signal, a second clock signal, a start pulse signal, and a reset signal.

Connection relationships of the shift register of FIG. 18 are described. In the flip-flop 5701_i (one of the flip-flops 5701_1 to 5701_n) of the i-th stage in the shift register of FIG. 18, a first wiring 5501 shown in FIG. 19 is connected to a seventh wiring 5717_i−1; a second wiring 5502 shown in FIG. 19 is connected to a seventh wiring 5717_i+1; a third wiring 5503 shown in FIG. 19 is connected to a seventh wiring 5717_i; and a sixth wiring 5506 shown in FIG. 19 is connected to a fifth wiring 5715.

Figure 19:
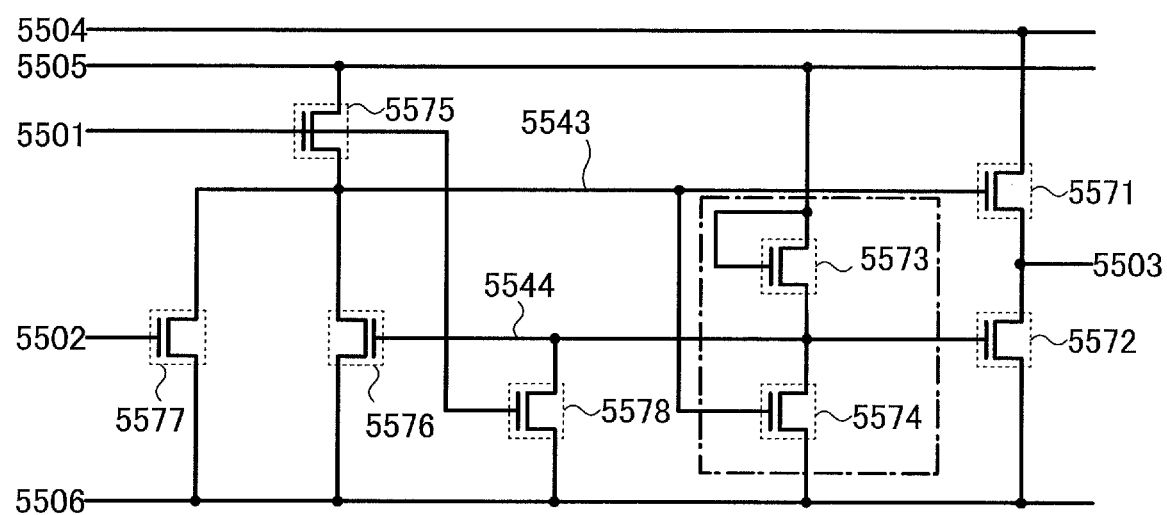
FIG. 19 illustrates a connection structure of the flip-flop illustrated in FIG. 18.

Further, a fourth wiring 5504 shown in FIG. 19 is connected to a second wiring 5712 in flip-flops of odd-numbered stages, and is connected to a third wiring 5713 in flip-flops of even-numbered stages. A fifth wiring 5505 shown in FIG. 19 is connected to a fourth wiring 5714.

Note that the first wiring 5501 shown in FIG. 19 of the flip-flop 5701_1 of a first stage is connected to a first wiring 5711, and the second wiring 5502 shown in FIG. 19 of the flip-flop 5701_n of an n-th stage is connected to a sixth wiring 5716.

The first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

FIG. 19 illustrates the detail of the flip-flop shown in FIG. 18. A flip-flop shown in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are n-channel transistors, and are turned on when the gate-source voltage ($V_{gs}$) exceeds the threshold voltage ($V_{th}$).

In FIG. 19, a gate electrode of the third thin film transistor 5573 is electrically connected to the power supply line. Further, it can be said that a circuit in which the third thin film transistor 5573 is connected to the fourth thin film transistor 5574 (a circuit surrounded by the chain line in FIG. 19) corresponds to a circuit having the structure illustrated in FIG. 2A. Although the example in which all the thin film transistors are enhancement type n-channel transistors is described here, there is no limitation to this example. For example, the driver circuit can be driven even with the use of a depletion type n-channel transistor as the third thin film transistor 5573.

Now, a connection structure of the flip-flop shown in FIG. 19 is described below.

A first electrode (one of a source electrode or a drain electrode) of the first thin film transistor 5571 is connected to the fourth wiring 5504, and a second electrode (the other of the source electrode or the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

The first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 4. The n-channel TFT described in Embodiment 4 has a high mobility, and thus a driving frequency of a driver circuit can be increased. Further, parasitic capacitance is reduced by the source or drain region which is an In—Ga—Zn—O-based non-single-crystal film; thus, the n-channel TFT described in Embodiment 4 has high frequency characteristics (referred to as f characteristics). For example, a scan line driver circuit using the n-channel TFT described in Embodiment 4 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits is provided, a scan line driver circuit for driving even-numbered scan lines is provided on one side and a scan line driver circuit for driving odd-numbered scan lines is provided on the opposite side; thus, increase in frame frequency can be realized. Furthermore, the use of the plurality of scan line driver circuits for output of signals to the same scan line is advantageous in increasing the size of a display device.

In the case of manufacturing an active matrix light-emitting display device, which is an example of a semiconductor device of the present invention, a plurality of scan line driver circuits are preferably arranged because a plurality of thin film transistors are arranged in at least one pixel. An example of a block diagram of an active matrix light-emitting display device is illustrated in FIG. 14B.

Figure 14B:
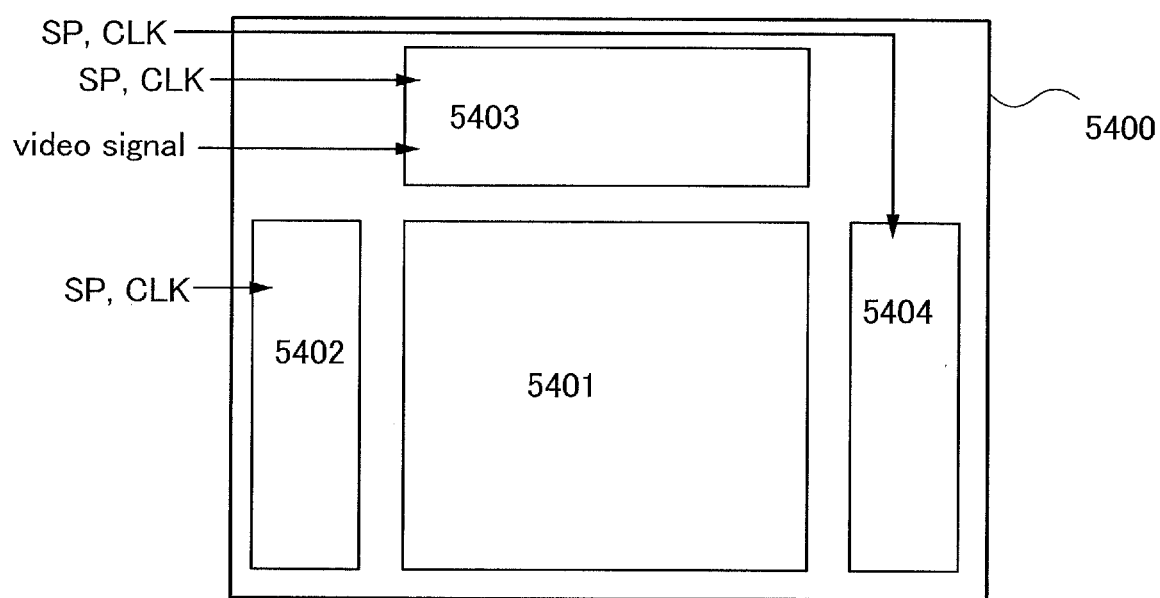

The light-emitting display device illustrated in FIG. 14B includes, over a substrate 5400, a pixel portion 5401 including a plurality of pixels each provided with a display element, a first scan line driver circuit 5402 and a second scan line driver circuit 5404 that select a pixel, and a signal line driver circuit 5403 that controls a video signal input to the selected pixel.

In the case of inputting a digital video signal to the pixel of the light-emitting display device of FIG. 14B, the pixel is put in a light-emitting state or non-light-emitting state by switching on/off of the transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale is displayed. Further, a time ratio grayscale method refers to a driving method by which a period during which a pixel is in a light-emitting state is controlled so that grayscale is displayed.

Since the response time of light-emitting elements is shorter than that of liquid crystal elements or the like, the light-emitting elements are suitable for a time ratio grayscale method. Specifically, in the case of displaying by a time grayscale method, one frame period is divided into a plurality of subframe periods. Then, in accordance with video signals, the light-emitting element in the pixel is put in a light-emitting state or a non-light-emitting state in each subframe period. By dividing a frame into a plurality of subframes, the total length of time in which pixels actually emit light in one frame period can be controlled with video signals to display grayscales.

Note that in the light-emitting display device of FIG. 14B, in the case where one pixel includes two switching TFTs, a signal which is input to a first scan line which is a gate wiring of one of the switching TFTs is generated in the first scan line driver circuit 5402 and a signal which is input to a second scan line which is a gate wiring of the other switching TFT is generated in the second scan line driver circuit 5404. However, both of the signals which are input to the first scan line and the second scan line may be generated in one scan line driver circuit. In addition, for example, there is a possibility that a plurality of scan lines used for controlling the operation of the switching elements be provided in each pixel depending on the number of switching TFTs included in one pixel. In this case, the signals which are input to the scan lines may all be generated in one scan line driver circuit or may be generated in a plurality of scan line driver circuits.

Also in the light-emitting display device, part of the driver circuit which can be formed using the n-channel TFTs can be provided over one substrate together with the thin film transistors of the pixel portion. Moreover, the signal line driver circuit and the scan line driver circuit can be manufactured using only the n-channel TFTs described in Embodiment 4 or 5.

The above driver circuit may be used for not only a liquid crystal display device or a light-emitting display device but also an electronic paper in which electronic ink is driven by utilizing an element electrically connected to a switching element. The electronic paper is also called an electrophoretic display device (electrophoretic display) and has advantages in that it has the same level of readability as regular paper, it has less power consumption than other display devices, and it can be made thin and lightweight.

There are a variety of modes of electrophoretic displays. The electrophoretic display is a device in which a plurality of microcapsules each including first particles having positive charge and second particles having negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a colorant, and does not move when there is not electric field. Also, a color of the first particles is different from a color of the second particles (the particles may also be colorless).

Thus, the electrophoretic display utilizes a so-called dielectrophoretic effect, in which a substance with high dielectric constant moves to a region with high electric field. The electrophoretic display does not require a polarizing plate and a counter substrate, which are necessary for a liquid crystal display device, so that the thickness and weight thereof are about half.

In electronic ink the microcapsules are dispersed in a solvent, and this electronic ink can be printed on a surface of glass, plastic, fabric, paper, or the like. Color display is also possible with the use of a color filter or particles including a coloring matter.

In addition, an active matrix display device can be completed by providing as appropriate, a plurality of the microcapsules over an active matrix substrate so as to be interposed between two electrodes, and can perform display by application of electric field to the microcapsules. For example, the active matrix substrate obtained using the thin film transistors described in Embodiment 4 or 5 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material thereof.

Through the above process, a highly reliable display device as a semiconductor device can be manufactured.

This embodiment can be implemented in appropriate combination with any of the structures described in the other embodiments.

Embodiment 7

A thin film transistor of an embodiment of the present invention is manufactured, and the thin film transistor can be used for a pixel portion and further for a driver circuit, so that a semiconductor device having a display function (also called a display device) can be manufactured. Moreover, the thin film transistor of an embodiment of the present invention can be used for part of a driver circuit or an entire driver circuit formed over one substrate together with a pixel portion, so that a system-on-panel can be formed.

The display device includes a display element. As the display element, a liquid crystal element (also referred to as a liquid crystal display element) or a light-emitting element (also referred to as a light-emitting display element) can be used. A light-emitting element includes, in its category, an element whose luminance is controlled by current or voltage, and specifically includes an inorganic electroluminescent (EL) element, an organic EL element, and the like. Further, a display medium whose contrast is changed by an electric effect, such as electronic ink, can be used.

In addition, the display device includes a panel in which a display element is sealed, and a module in which an IC and the like including a controller are mounted on the panel. An embodiment of the present invention further relates to one mode of an element substrate before the display element is completed in a process for manufacturing the display device, and the element substrate is provided with a plurality of pixels each having a means for supplying current to the display element. Specifically, the element substrate may be in a state after only a pixel electrode of the display element is formed, a state after a conductive film to be a pixel electrode is formed but before the conductive film is etched to be the pixel electrode, or any other states.

A display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module in which an integrated circuit (IC) is directly mounted on a display element by a chip-on-glass (COG) method.

The appearance and a cross section of a liquid crystal display panel which is one mode of a semiconductor device according to an embodiment of the present invention will be described in this embodiment with reference to FIGS. 22A1, 22A2, and 22B. FIGS. 22A1 and 22A2 are top views of panels in which thin film transistors 4010 and 4011 and a liquid crystal element 4013 which are formed over a first substrate 4001 are sealed with a sealant 4005 between the first substrate 4001 and a second substrate 4006. The thin film transistors 4010 and 4011 which are thin film transistors described in Embodiment 4 include an In—Ga—Zn—O-based non-single-crystal film as a semiconductor layer and have high reliability. FIG. 22B is a cross-sectional view taken along M-N of FIGS. 22A1 and 22A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealant 4005 between the first substrate 4001 and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on a connection method of the driver circuit which is separately formed, and a COG method, a wire bonding method, a TAB method, or the like can be used. FIG. 22A1 illustrates an example in which the signal line driver circuit 4003 is mounted by a COG method and FIG. 22A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 22B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, the thin film transistor including an In—Ga—Zn—O-based non-single-crystal film as a semiconductor layer and having high reliability which is described in Embodiment 4 can be employed. Alternatively, the thin film transistor described in Embodiment 5 may be employed. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 serving as alignment films, respectively, and hold the liquid crystal layer 4008 with the insulating layers 4032 and 4033 interposed therebetween.

Note that the first substrate 4001 and the second substrate 4006 can be formed from glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a blue phase liquid crystal for which an alignment film is unnecessary may be used. A blue phase is a type of liquid crystal phase, which appears just before a cholesteric liquid crystal changes into an isotropic phase when the temperature of the cholesteric liquid crystal is increased. A blue phase appears only within a narrow temperature range; therefore, the liquid crystal layer 4008 is formed using a liquid crystal composition containing a chiral agent at 5 wt. % or more in order to expand the temperature range. The liquid crystal composition including a blue phase liquid crystal and a chiral agent has a short response time of 10 μs to 100 μs, and is optically isotropic; therefore, alignment treatment is not necessary and viewing angle dependence is small.

Note that this embodiment describes an example of a transmissive liquid crystal display device; however, an embodiment of the present invention can be applied to a reflective liquid crystal display device or a transflective liquid crystal display device.

Although a liquid crystal display device of this embodiment has a polarizing plate provided outer than the substrate (the viewer side) and a coloring layer and an electrode layer of a display element provided inner than the substrate, which are arranged in that order, the polarizing plate may be inner than the substrate. The stacked structure of the polarizing plate and the coloring layer is not limited to that shown in this embodiment and may be set as appropriate in accordance with the materials of the polarizing plate and the coloring layer and the condition of the manufacturing process. Further, a light-blocking film serving as a black matrix may be provided.

In this embodiment, in order to reduce the unevenness of the surface of the thin film transistors and to improve the reliability of the thin film transistors, the thin film transistors which are obtained in Embodiment 4 are covered with protective films or insulating layers (the insulating layers 4020 and 4021) serving as planarizing insulating films. Note that the protective film is provided to prevent entry of impurities floating in air, such as an organic substance, a metal substance, or moisture, and is preferably a dense film. The protective film may be formed by a sputtering method using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective film is formed by a sputtering method in this embodiment, the method is not limited to a particular method and may be selected from a variety of methods.

Here, the insulating layer 4020 is formed to have a stacked structure as the protective film. Here, a silicon oxide film is formed by a sputtering method as a first layer of the insulating layer 4020. The use of a silicon oxide film for the protective film provides an advantageous effect of preventing hillock of an aluminum film used for a source electrode layer and a drain electrode layer.

Moreover, an insulating layer is formed as a second layer of the protective film. Here, a silicon nitride film is formed by a sputtering method as a second layer of the insulating layer 4020. When a silicon nitride film is used for the protective film, it is possible to prevent movable ions such as sodium from entering a semiconductor region to change the electrical characteristics of the TFT.

Further, after the protective film is formed, the semiconductor layer may be annealed (at 300° C. to 400° C.).

Further, the insulating layer 4021 is formed as the planarizing insulating film. The insulating layer 4021 can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed from these materials.

Note that a siloxane-based resin is a resin formed from a siloxane-based material as a starting material and having the bond of Si—O—Si. The siloxane-based resin may include an organic group (such as an alkyl group and an aryl group) or a fuoro group as a substituent. The organic group may include a fluoro group.

The method for the formation of the insulating layer 4021 is not limited to a particular method and the following method can be used depending on the material of the insulating layer 4021: a sputtering method, an SOG method, spin coating, dip coating, spray coating, a droplet discharge method (e.g., an inkjet method, screen printing, or offset printing), a doctor knife, a roll coater, a curtain coater, a knife coater, or the like. In the case of forming the insulating layer 4021 with the use of a material solution, annealing (at 300° C. to 400° C.) may be performed on a semiconductor layer at the same time as a baking step. When the baking step of the insulating layer 4021 and the annealing of the semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed of the conductive composition has preferably a sheet resistance of 10000 Ω/square or less and a transmittance of 70% or more at a wavelength of 550 nm. Further, the resistivity of the conductive high molecule included in the conductive composition is preferably 0.1 Ω·cm or less.

As the conductive high molecule, a so-called 7c-electron conjugated conductive polymer can be used. As examples thereof, polyaniline or a derivative thereof, polypyrrole or a derivative thereof, polythiophene or a derivative thereof, a copolymer of two or more of them can be given.

Further, a variety of signals and potentials are supplied from an FPC 4018 to the signal line driver circuit 4003 which is formed separately, the scan line driver circuit 4004, and the pixel portion 4002.

In this embodiment, a connecting terminal electrode 4015 is formed using the same conductive film as the pixel electrode layer 4030 included in the liquid crystal element 4013, and a terminal electrode 4016 is formed using the same conductive film as the source and drain electrode layers of the thin film transistors 4010 and 4011.

The connecting terminal electrode 4015 is electrically connected to a terminal of the FPC 4018 through an anisotropic conductive film 4019.

Although FIGS. 22A1, 22A2, and 22B show an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

Figure 23:
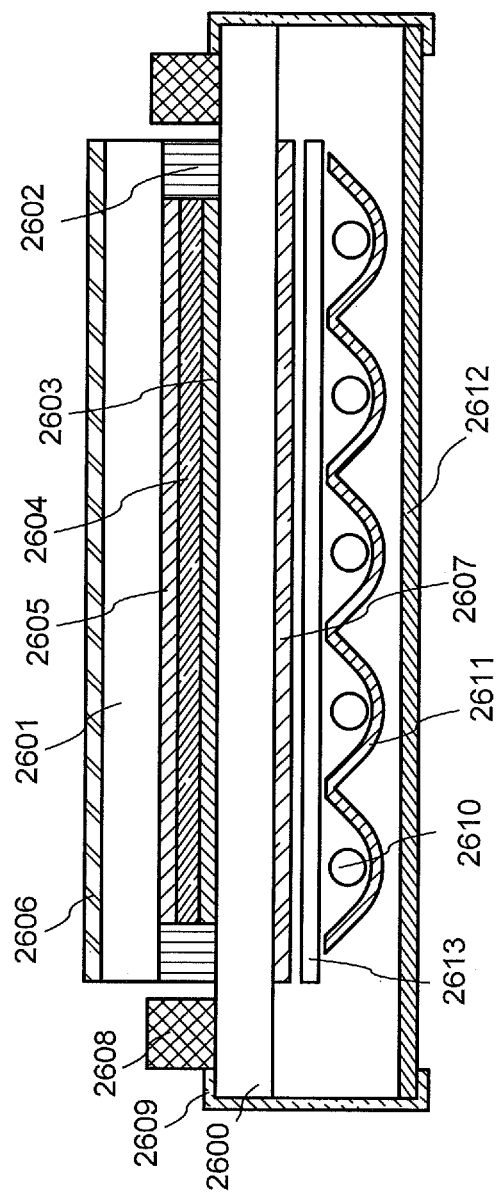
FIG. 23 illustrates a semiconductor device.

FIG. 23 illustrates an example in which a liquid crystal display module is formed as a semiconductor device using a TFT substrate 2600 manufactured according to an embodiment of the present invention.

FIG. 23 illustrates an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the case of the RGB system, coloring layers corresponding to colors of red, green, and blue are provided for pixels. Polarizing plates 2606 and 2607 and a diffuser plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, or the like can be employed.

Through the above process, a highly reliable liquid crystal display panel as a semiconductor device can be manufactured.

This embodiment can be implemented in appropriate combination with any of the structures described in the other embodiments.

Embodiment 8

In this embodiment, an example of an electronic paper will be described as a semiconductor device of an embodiment of the present invention.

Figure 13:
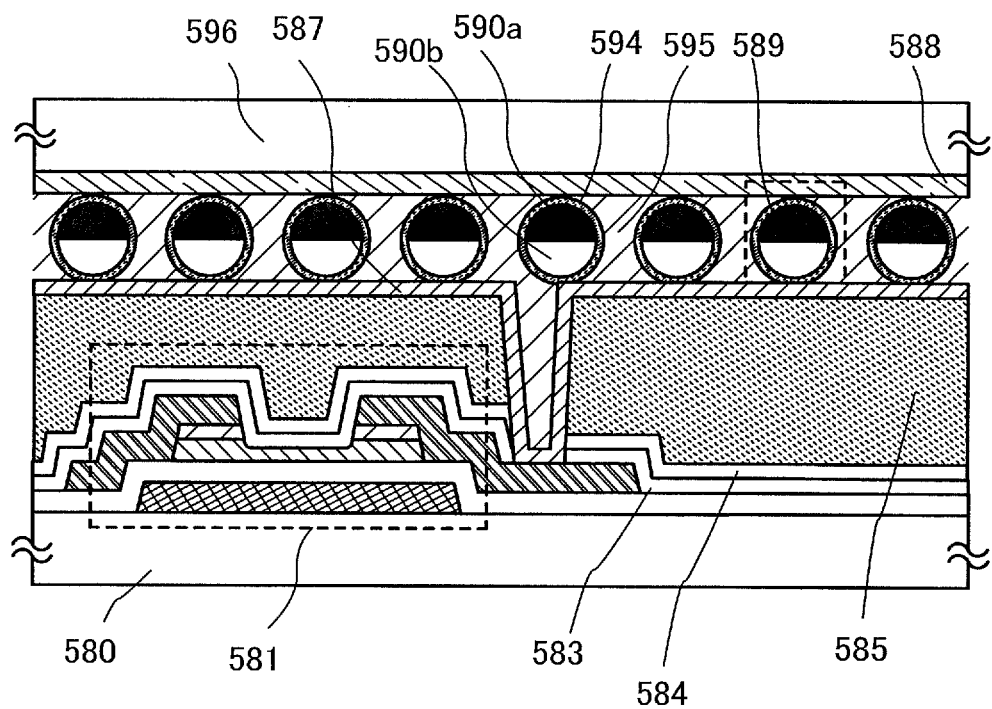
FIG. 13 illustrates a semiconductor device.

FIG. 13 illustrates an active matrix electronic paper as an example of a semiconductor device to which an embodiment of the present invention is applied. A thin film transistor 581 used for the semiconductor device can be manufactured in a manner similar to that of the thin film transistor described in Embodiment 4 and is a highly reliable thin film transistor including an In—Ga—Zn—O-based non-single-crystal film as a semiconductor layer. The thin film transistor described in Embodiment 5 can also be used as the thin film transistor 581 in this embodiment.

The electronic paper of FIG. 13 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure, and a source or drain electrode layer thereof is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 13). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion which is described in any of Embodiments 1 to 3, the second electrode layer 588 can be electrically connected to the common potential line through conductive particles provided between a pair of substrates.

Instead of the twisting ball, an electrophoretic element can also be used. A microcapsule having a diameter of about 10 to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented in appropriate combination with any of the structures described in the other embodiments.

Embodiment 9

This embodiment describes an example of a light-emitting display device as a semiconductor device according to an embodiment of the present invention. As an example of a display element of the display device, here, a light-emitting element utilizing electroluminescence is described. Light-emitting elements utilizing electroluminescence are classified according to whether a light emitting material is an organic compound or an inorganic compound. In general, the former is referred to as an organic EL element and the latter is referred to as an inorganic EL element.

In an organic EL element, by application of a voltage to a light-emitting element, electrons and holes are separately injected from a pair of electrodes into a layer containing a light-emitting organic compound, and thus current flows. Then, those carriers (i.e., electrons and holes) are recombined, and thus, the light-emitting organic compound is excited. When the light-emitting organic compound returns to a ground state from the excited state, light is emitted. Owing to such a mechanism, this light emitting element is referred to as a current-excitation light emitting element.

The inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element in this example.

Figure 20:
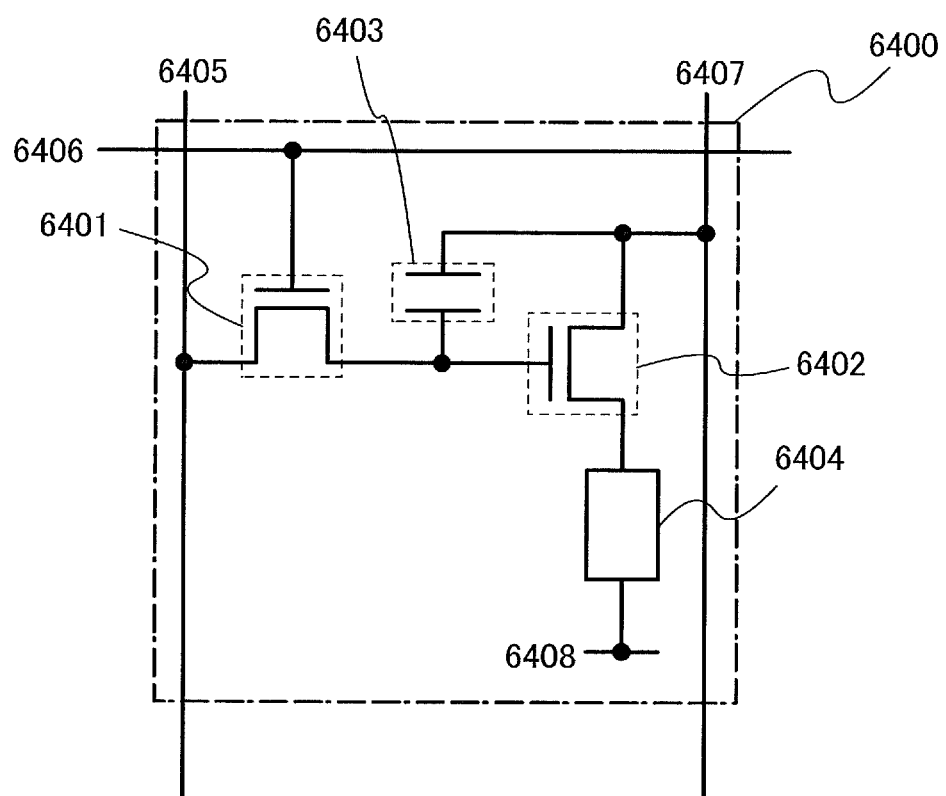
FIG. 20 illustrates a pixel equivalent circuit of a semiconductor device.

FIG. 20 illustrates an example of a pixel structure to which digital time grayscale driving can be applied, as an example of a semiconductor device to which an embodiment of the present invention is applied.

A structure and operation of a pixel to which digital time grayscale driving can be applied are described. In this example, one pixel includes two n-channel transistors in each of which an oxide semiconductor layer (an In—Ga—Zn—O-based non-single-crystal film) in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the structure illustrated in FIG. 1A, FIG. 2A, or FIG. 3A may be obtained using the connection portion as a common connection portion.

The second electrode (common electrode 6408) of the light-emitting element 6404 is set to a low power supply potential. The low power supply potential is a potential smaller than a high power supply potential when the high power supply potential set to the power supply line 6407 is a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. In order to make the light-emitting element 6404 emit light, potentials are set so that the potential difference between the high power supply potential and the low power supply potential is greater than or equal to the forward threshold voltage of the light-emitting element 6404.

Gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is either substantially turned on or substantially turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage which is higher than or equal to the sum of the voltage of the power supply line and the Vth of the driver transistor 6402 is applied to the signal line 6405.

In the case of performing analog grayscale driving instead of digital time grayscale driving, the same pixel structure as that in FIG. 20 can be used by changing signal input.

In the case of performing analog grayscale driving, a voltage higher than or equal to the sum of the forward voltage of the light-emitting element 6404 and the Vth of the driver transistor 6402 is applied to the gate of the driver transistor 6402. The forward voltage of the light-emitting element 6404 indicates a voltage at which a desired luminance is obtained, and includes at least a forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure shown in FIG. 20 is not limited thereto. For example, a switch, a resistor, a capacitor, a transistor, a logic circuit, or the like may be added to the pixel shown in FIG. 20.

Figure 21A:
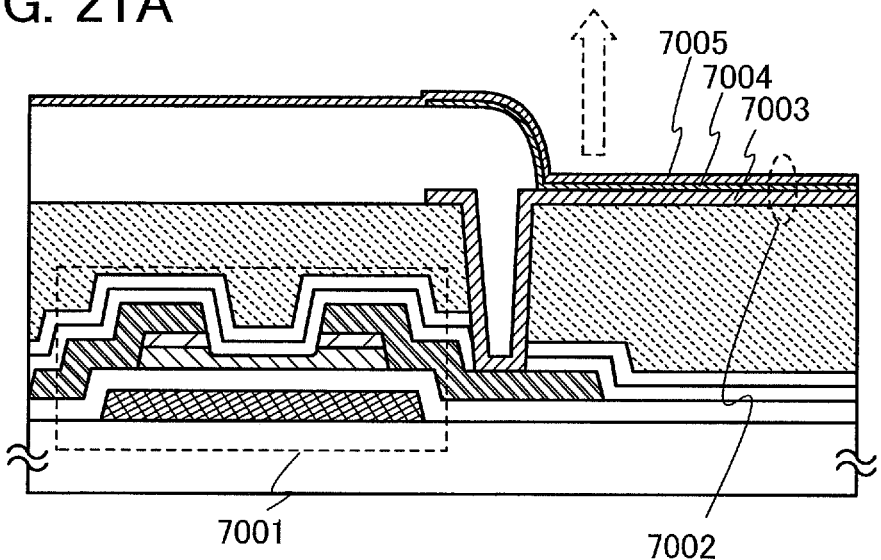
FIGS. 21A to 21C illustrate a semiconductor device.
Figure 21B:
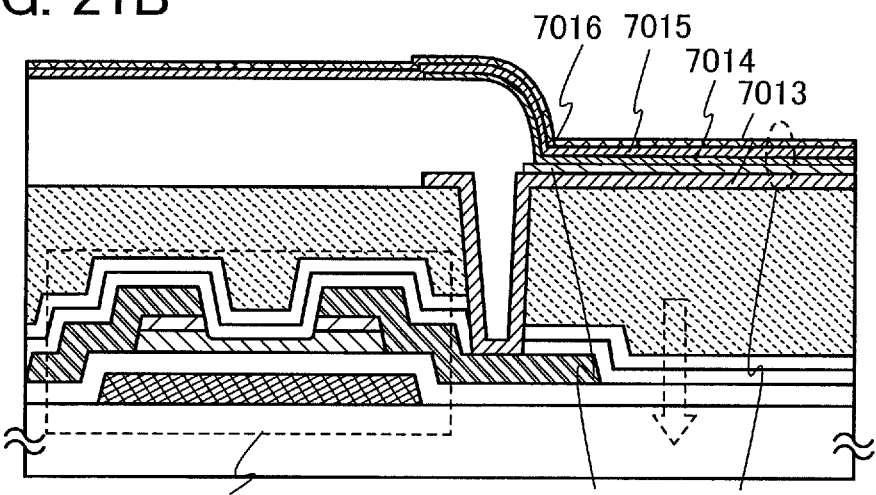
Figure 21C:
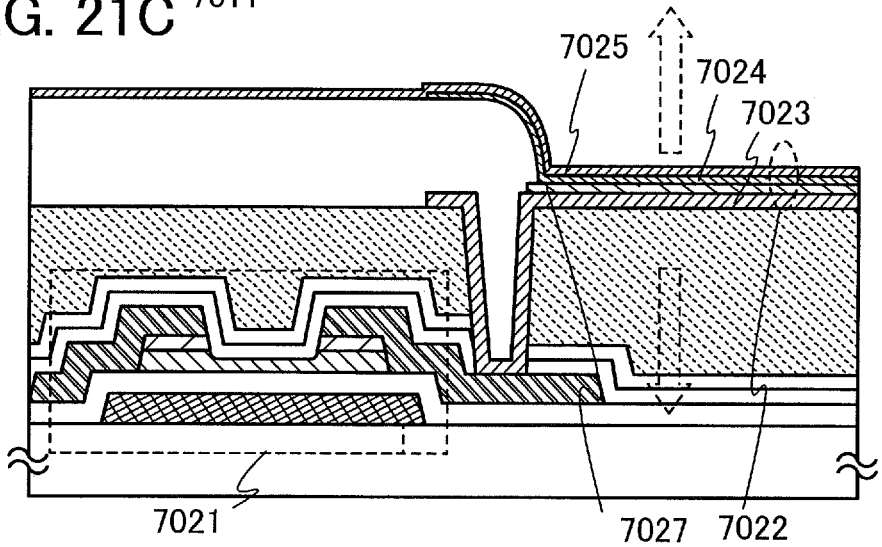

Next, structures of a light-emitting element are described with reference to FIGS. 21A to 21C. A cross-sectional structure of a pixel is described here by taking an n-channel driver TFT as an example. TFTs 7001, 7011, and 7021 serving as driver TFTs used for a semiconductor device, which are illustrated in FIGS. 21A to 21C, can be formed by a method similar to the method for forming the thin film transistor described in Embodiment 4. The TFTs 7001, 7011, and 7021 have high reliability and each include an In—Ga—Zn—O-based non-single-crystal film as a semiconductor layer. The thin film transistor described in Embodiment 5 can also be used as the TFTs 7001, 7011, and 7021.

In addition, in order to extract light emitted from the light-emitting element, at least one of an anode and a cathode is required to transmit light. A thin film transistor and a light-emitting element are formed over a substrate. A light-emitting element can have a top-emission structure in which light is extracted through the surface opposite to the substrate; a bottom-emission structure in which light is extracted through the surface on the substrate side; or a dual-emission structure in which light is extracted through the surface opposite to the substrate and the surface on the substrate side. The pixel structure according to an embodiment of the present invention can be applied to a light-emitting element having any of these emission structures.

A light-emitting element with a top-emission structure is described with reference to FIG. 21A.

FIG. 21A is a cross-sectional view of a pixel in a case where the TFT 7001 serving as a driver TFT is an n-channel TFT and light generated in a light-emitting element 7002 is emitted to an anode 7005 side. In FIG. 21A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of conductive materials which have a low work function and reflect light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film formed from a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 21A, light is emitted from the light-emitting element 7002 to the anode 7005 side as indicated by an arrow.

Next, a light-emitting element having a bottom-emission structure is described with reference to FIG. 21B. FIG. 21B is a cross-sectional view of a pixel in the case where the driver TFT 7011 is an n-channel TFT, and light is emitted from a light-emitting element 7012 to a cathode 7013 side. In FIG. 21B, the cathode 7013 of the light-emitting element 7012 is formed over a conductive film 7017 having a light-transmitting property which is electrically connected to the driver TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, any of conductive materials which have a low work function can be used as in the case of FIG. 21A. Note that the cathode 7013 is formed to have a thickness with which the cathode 7013 can transmit light (preferably, approximately from 5 nm to 30 nm). For example, an aluminum film with a thickness of 20 nm can be used as the cathode 7013. The light-emitting layer 7014 may be formed of a single layer or by stacking a plurality of layers as in the case of FIG. 21A. The anode 7015 is not required to transmit light, but can be formed using a light-transmitting conductive material as in the case of FIG. 21A. For the light-blocking film 7016, metal or the like that reflects light can be used; however, it is not limited to a metal film. For example, a resin or the like to which black pigment is added can be used.

The light-emitting element 7012 corresponds to a region where the cathode 7013 and the anode 7015 sandwich the light-emitting layer 7014. In the case of the pixel illustrated in FIG. 21B, light is emitted from the light-emitting element 7012 to the cathode 7013 side as indicated by an arrow.

Next, a light-emitting element having a dual-emission structure is described with reference to FIG. 21C. In FIG. 21C, a cathode 7023 of a light-emitting element 7022 is formed over a conductive film 7027 having a light-transmitting property which is electrically connected to the driver TFT 7021, and a light-emitting layer 7024 and an anode 7025 are stacked in this order over the cathode 7023. As in the case of FIG. 21A, the cathode 7023 can be formed of any of conductive materials which have a low work function. Note that the cathode 7023 is formed to have a thickness with which the cathode 7023 can transmit light. For example, an Al film having a thickness of 20 nm can be used as the cathode 7023. The light-emitting layer 7024 may be formed using a single layer or by stacking a plurality of layers as in the case of FIG. 21A. In a manner similar to FIG. 21A, the anode 7025 can be formed using a light-transmitting conductive material.

The light-emitting element 7022 corresponds to a region where the cathode 7023, the light-emitting layer 7024, and the anode 7025 overlap with each other. In the pixel illustrated in FIG. 21C, light is emitted from the light-emitting element 7022 to both the anode 7025 side and the cathode 7023 side as indicated by arrows.

Although an organic EL element is described here as a light-emitting element, an inorganic EL element can be alternatively provided as a light-emitting element.

Note that this embodiment describes the example in which a thin film transistor (driver TFT) which controls the driving of a light-emitting element is electrically connected to the light-emitting element, but a structure may be employed in which a current control TFT is connected between the driver TFT and the light-emitting element.

The semiconductor device described in this embodiment is not limited to the structures illustrated in FIGS. 21A to 21C, and can be modified in various ways based on the spirit of techniques according to the present invention.

Figure 24A:
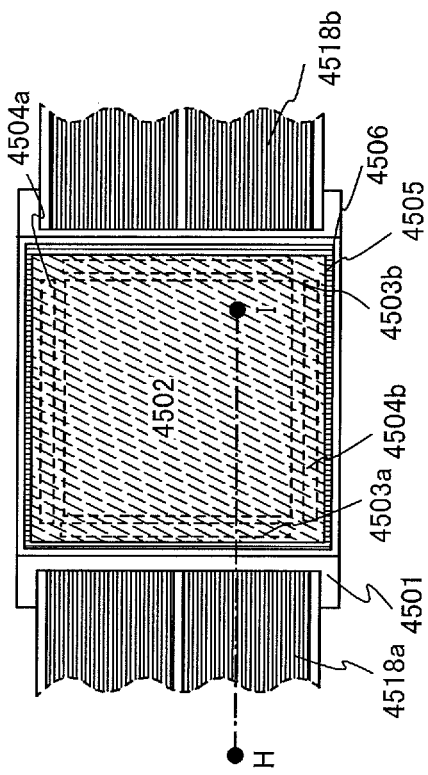
FIGS. 24A and 24B illustrate a semiconductor device.
Figure 24B:
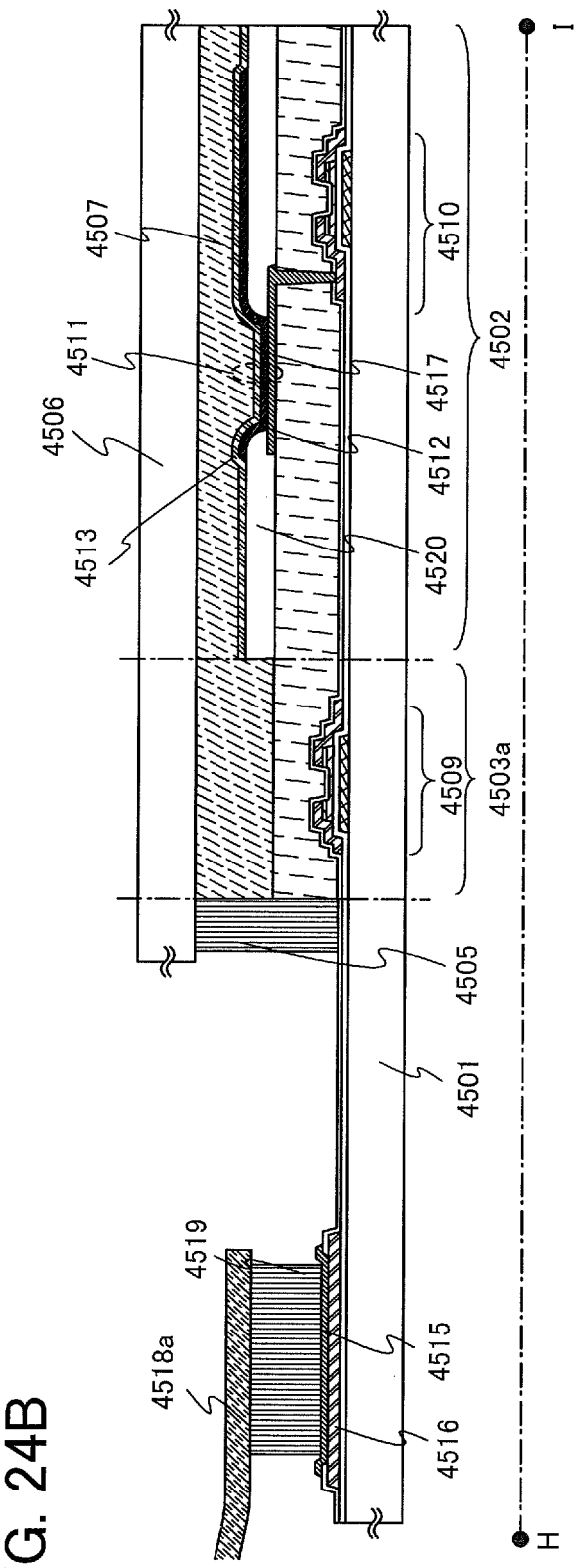

Next, the appearance and cross section of a light-emitting display panel (also referred to as a light-emitting panel) which is one mode of a semiconductor device according to the present invention will be described with reference to FIGS. 24A and 24B. FIG. 24A is a top view of a panel in which a light-emitting element and a thin film transistor over a first substrate are sealed with a sealant between the first substrate and a second substrate. FIG. 24B is a cross-sectional view along H-I of FIG. 24A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is formed over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with a filler 4507, with the first substrate 4501, the sealant 4505, and the second substrate 4506. In this manner, it is preferable that the light-emitting display panel be packaged (sealed) with a protective film (such as an attachment film or an ultraviolet curable resin film) or a cover material with high air-tightness and little degasification so as not to be exposed to external air.

The pixel portion 4502, the signal line driver circuits 4503a and 4503b, and the scan line driver circuits 4504a and 4504b formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 24B.

As the thin film transistors 4509 and 4510, a thin film transistor described in Embodiment 4 which has high reliability and includes an In—Ga—Zn—O-based non-single-crystal film as a semiconductor layer can be used. Further, the thin film transistor described in Embodiment 5 can be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited thereto. The structure of the light-emitting element 4511 can be changed as appropriate depending on a direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion on the first electrode layer 4517 so that a sidewall of the opening portion is formed as an inclined surface with a continuous curvature.

The electroluminescent layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film such as a polarizing plate, a circularly polarizing plate (including an elliptically polarizing plate), a retardation plate (a quarter-wave plate or a half-wave plate), and a color filter may be provided as appropriate on an emission surface of the light-emitting element. Further, the polarizing plate or the circularly polarizing plate may be provided with an anti-reflection film. For example, anti-glare treatment can be performed by which reflected light is diffused by depressions and projections of the surface and glare can be reduced.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. In addition, only the signal line driver circuits or only part thereof, or only the scan line driver circuits or only part thereof may be separately formed and then mounted. This embodiment is not limited to the structure shown in FIGS. 24A and 24B.

Through this process, a highly reliable light-emitting device (display panel) as a semiconductor device can be manufactured.

This embodiment can be implemented in appropriate combination with any of the structures described in the other embodiments.

Embodiment 10

A semiconductor device according to an embodiment of the present invention can be applied as an electronic paper. An electronic paper can be used for electronic appliances of a variety of fields for displaying information. For example, an electronic paper can be used for electronic book reader (an e-book reader), posters, advertisement in vehicles such as trains, displays of various cards such as credit cards, and the like. Examples of such electronic appliances are illustrated in FIGS. 25A and 25B and FIG. 26.

Figure 25A:
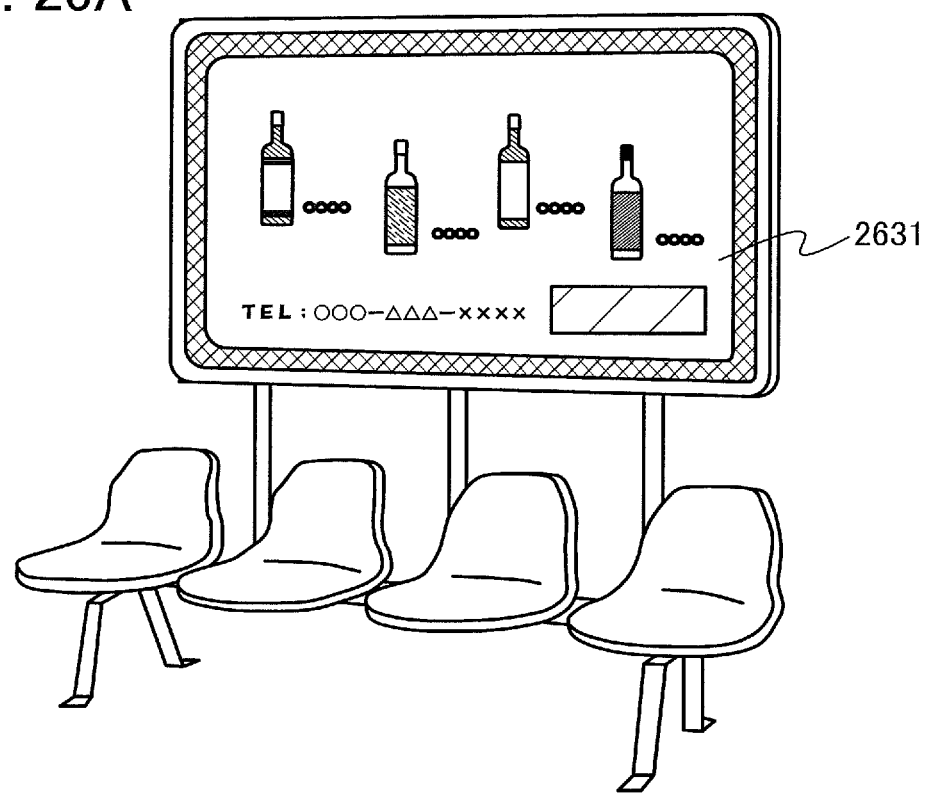
FIGS. 25A and 25B each illustrate an example of a usage pattern of an electronic paper.

FIG. 25A illustrates a poster 2631 formed using an electronic paper. If the advertising medium is printed paper, the advertisement is replaced by hands; however, when an electronic paper to which an embodiment of the present invention is applied is used, the advertisement display can be changed in a short time. Moreover, a stable image can be obtained without defects. Further, the poster may send and receive information wirelessly.

Figure 25B:
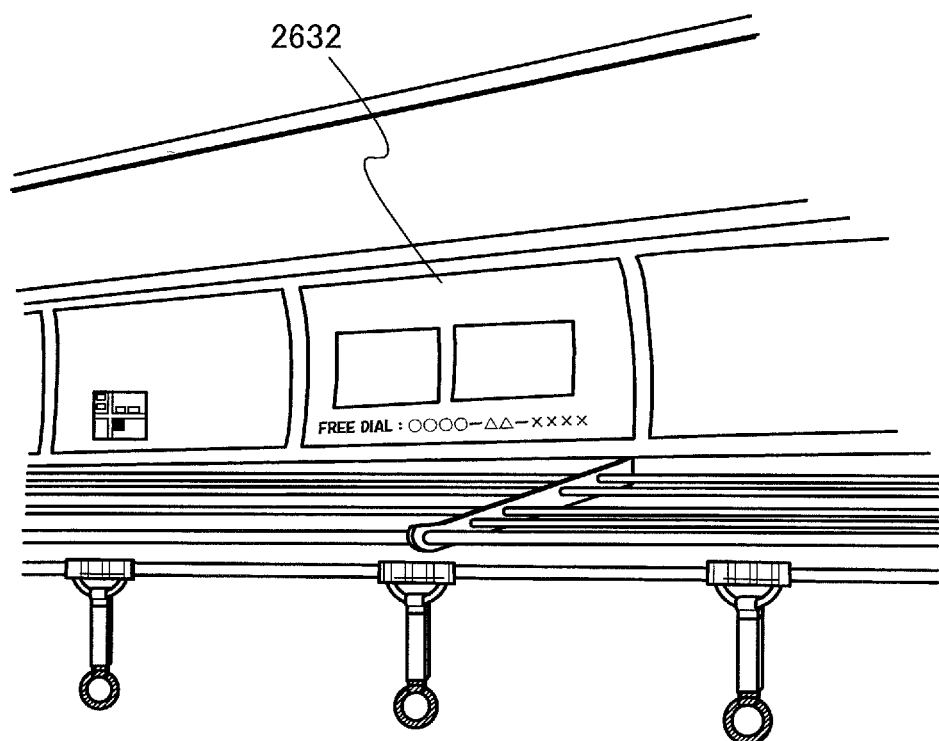

FIG. 25B illustrates an advertisement 2632 in a vehicle such as a train. If the advertising medium is printed paper, the advertisement is replaced by hands; however, when an electronic paper to which an embodiment of the present invention is applied is used, the advertisement display can be changed in a short time without much manpower. Moreover, a stable image can be obtained without defects. Further, the advertisement in vehicles may send and receive information wirelessly.

Figure 26:
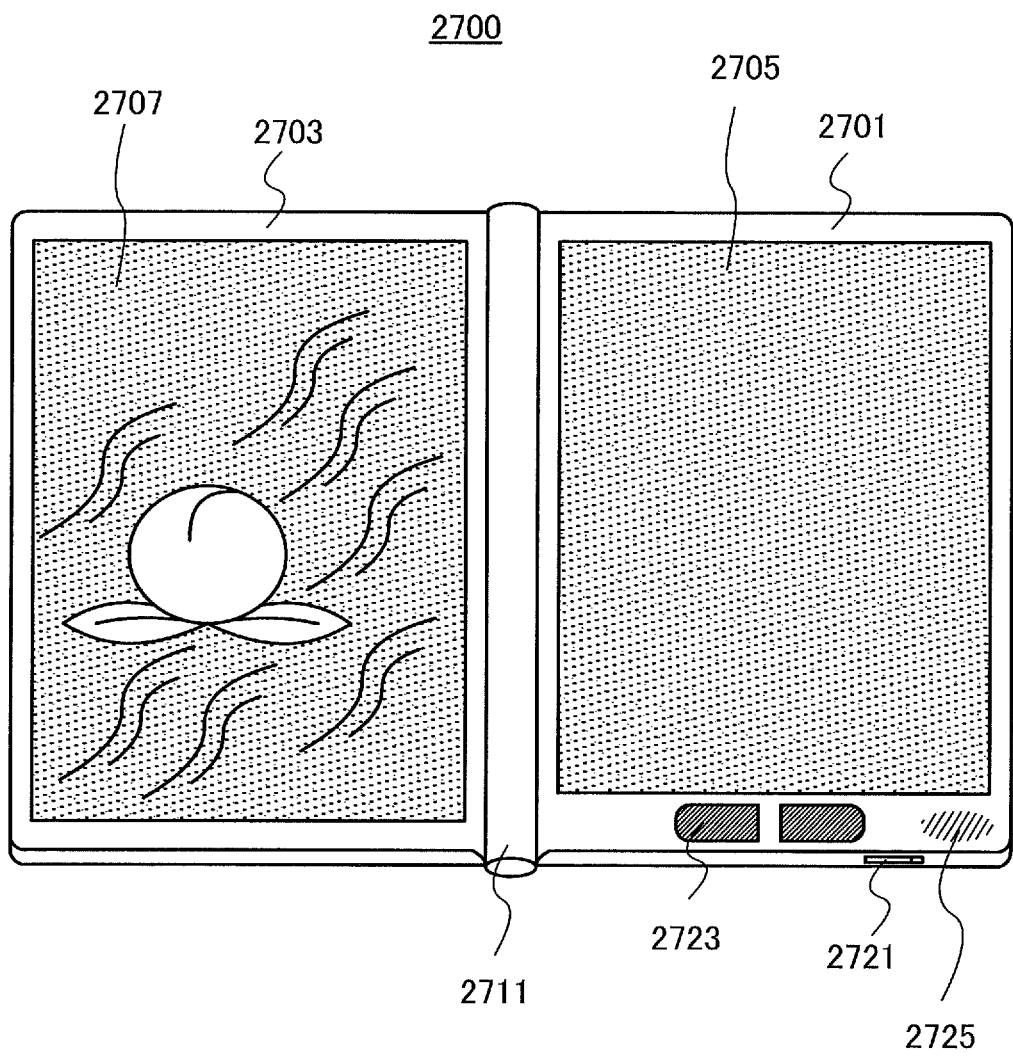
FIG. 26 is an external view of an example of an electronic book reader.

FIG. 26 illustrates an example of an electronic book reader 2700. For example, the electronic book reader 2700 includes two housings 2701 and 2703. The housings 2701 and 2703 are bonded with a hinge 2711 so that the electronic book reader 2700 can be opened and closed along the hinge 2711. With such a structure, the electronic book reader 2700 can be handled like a paper book.

A display portion 2705 is incorporated in the housing 2701 and a display portion 2707 is incorporated in the housing 2703. The display portion 2705 and the display portion 2707 may display one image, or may display different images. In the structure where different images are displayed on the display portion 2705 and the display portion 2707, for example, the right display portion (the display portion 2705 in FIG. 26) can display text and the left display portion (the display portion 2707 in FIG. 26) can display images.

FIG. 26 illustrates an example in which the housing 2701 is provided with an operation portion and the like. For example, the housing 2701 is provided with a power supply switch 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adopter or a USB cable, and the like), a storage medium inserting portion, or the like. Moreover, the electronic book reader 2700 may have a function of an electronic dictionary.

Further, the electronic book reader 2700 may send and receive information wirelessly. Desired book data or the like can be purchased and downloaded from an electronic book server wirelessly.

Embodiment 11

A semiconductor device of an embodiment of the present invention can be applied to a variety of electronic appliances (including game machines). As the electronic appliances, for example, there are a television device (also called a television or a television receiver), a monitor for a computer or the like, a camera such as a digital camera or a digital video camera, a digital photo frame, a cellular phone (also called a mobile phone or a mobile telephone device), a portable game console, a portable information terminal, an audio playback device, and a large game machine such as a pachinko machine.

Figure 27A:
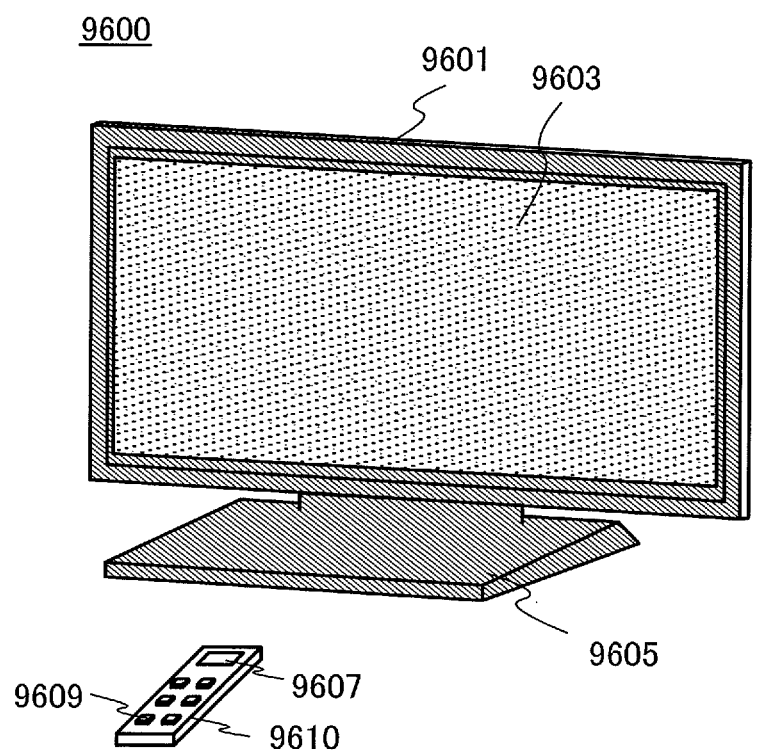
FIG. 27A is an external view of an example of a television device and FIG. 27B is an external view of an example of a digital photo frame.

FIG. 27A illustrates an example of a television device 9600. A display portion 9603 is incorporated in a housing 9601 of the television device 9600. The display portion 9603 can display images. Here, the housing 9601 is supported on a stand 9605.

The television device 9600 can be operated by an operation switch of the housing 9601 or a separate remote controller 9610. The channel and volume can be controlled with operation keys 9609 of the remote controller 9610 and the images displayed on the display portion 9603 can be controlled. Moreover, the remote controller 9610 may have a display portion 9607 on which the information outgoing from the remote controller 9610 is displayed.

Note that the television device 9600 is provided with a receiver, a modem, and the like. With the receiver, general television broadcasting can be received. Moreover, when the display device is connected to a communication network with or without wires via the modem, one-way (from a sender to a receiver) or two-way (e.g., between a sender and a receiver or between receivers) information communication can be performed.

Figure 27B:
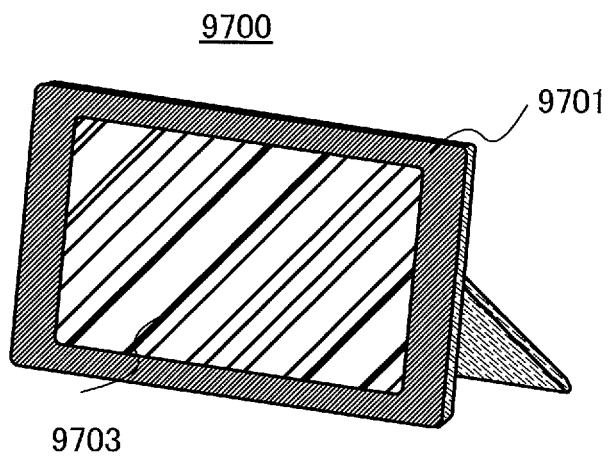

FIG. 27B illustrates an example of a digital photo frame 9700. For example, a display portion 9703 is incorporated in a housing 9701 of the digital photo frame 9700. The display portion 9703 can display a variety of images, for example, displays image data taken with a digital camera or the like, so that the digital photo frame can function in a manner similar to a general picture frame.

Note that the digital photo frame 9700 is provided with an operation portion, an external connection terminal (such as a USB terminal or a terminal which can be connected to a variety of cables including a USB cable), a storage medium inserting portion, and the like. They may be incorporated on the same plane as the display portion; however, they are preferably provided on a side surface or the rear surface of the display portion because the design is improved. For example, a memory including image data taken with a digital camera is inserted into the storage medium inserting portion of the digital photo frame and the image data is imported. Then, the imported image data can be displayed on the display portion 9703.

The digital photo frame 9700 may send and receive information wirelessly. Via wireless communication, desired image data can be wirelessly imported into the digital photo frame 9700 and displayed.

Figure 28A:
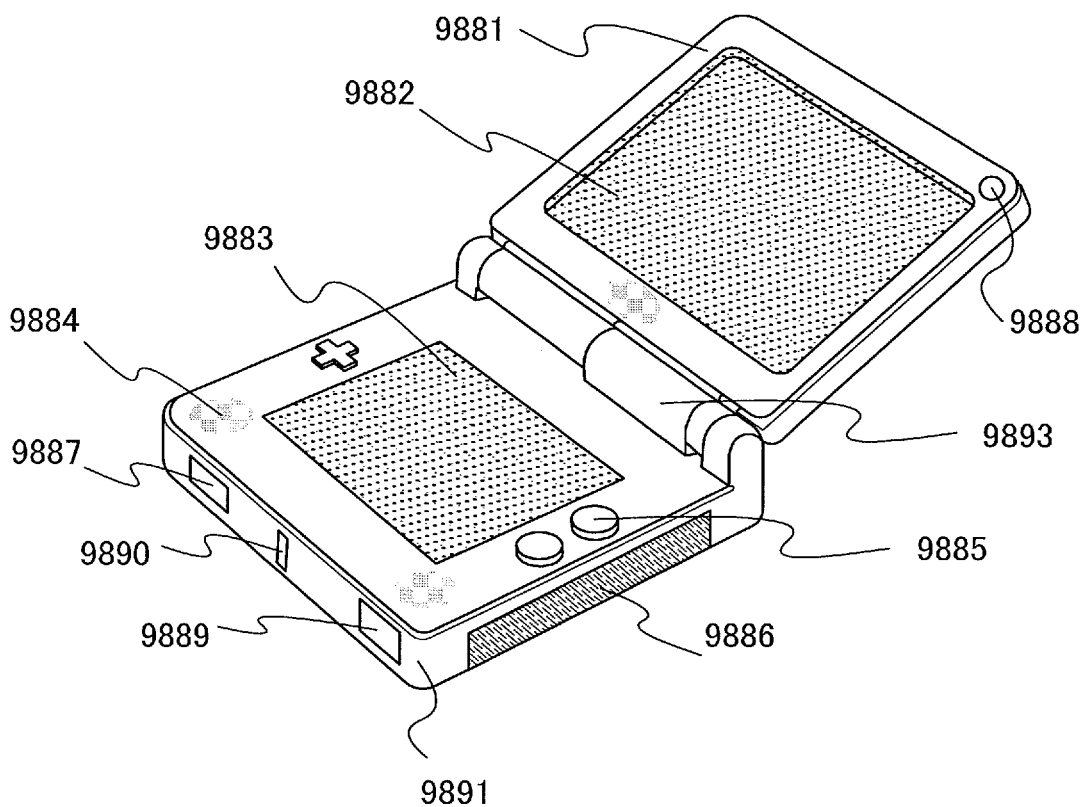
FIGS. 28A and 28B each illustrate an example of an amusement machine.

FIG. 28A illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 28A additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. Needless to say, the structure of the portable game console is not limited to the above, and may be any structure which is provided with at least a semiconductor device according to an embodiment of the present invention. Moreover, another accessory may be provided as appropriate. The portable game console illustrated in FIG. 28A has a function of reading a program or data stored in a storage medium to display it on the display portion, and a function of sharing information with another portable game console via wireless communication. The portable game console of FIG. 28A can have a variety of functions other than those above.

Figure 28B:
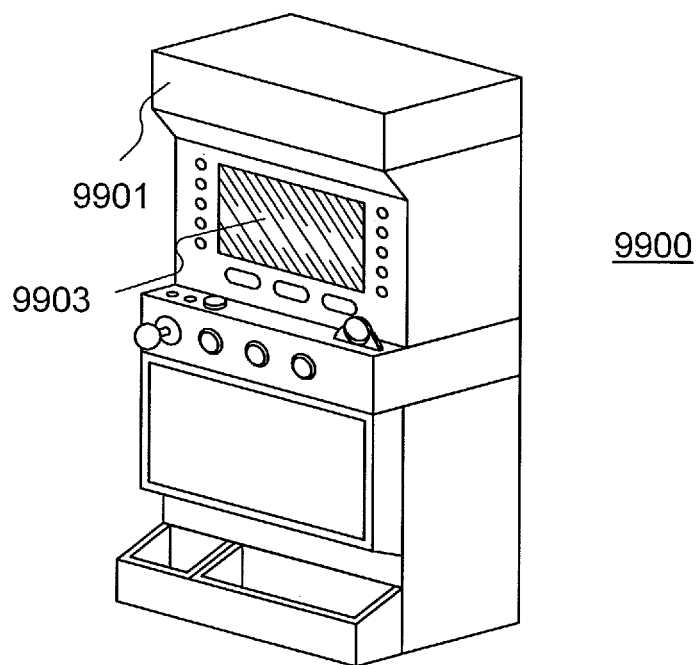

FIG. 28B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above and may be any structure which is provided with at least a semiconductor device of an embodiment of the present invention. Moreover, another accessory may be provided as appropriate.

Figure 29A:
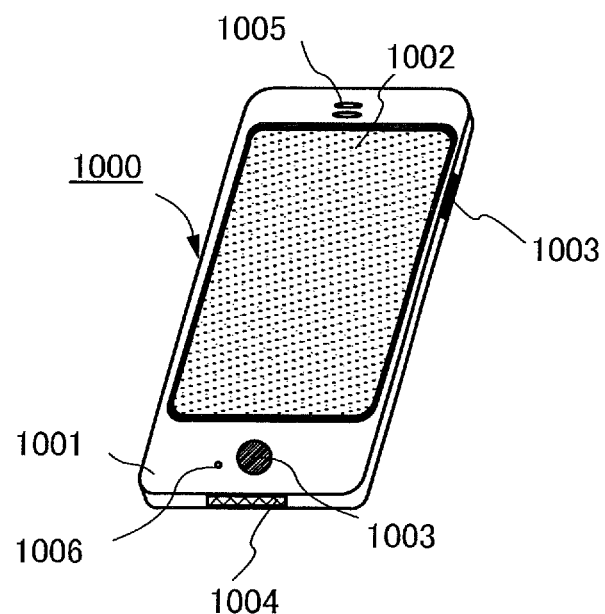
FIGS. 29A and 29B each illustrate an example of a mobile phone.

FIG. 29A illustrates an example of a cellular phone 1000. The cellular phone 1000 includes a housing 1001 in which a display portion 1002 is incorporated, and moreover includes an operation button 1003, an external connection port 1004, a speaker 1005, a microphone 1006, and the like.

Information can be input to the cellular phone 1000 illustrated in FIG. 29A by touching the display portion 1002 with a finger or the like. Moreover, calling or text messaging can be performed by touching the display portion 1002 with a finger or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are mixed.

For example, in the case of calling or text messaging, the display portion 1002 is set to a text input mode mainly for inputting text, and text input operation can be performed on a screen. In this case, it is preferable to display a keyboard or number buttons on almost the entire screen of the display portion 1002.

When a detection device including a sensor for detecting inclination, such as a gyroscope or an acceleration sensor, is provided inside the cellular phone 1000, display on the screen of the display portion 1002 can be automatically switched by judging the direction of the cellular phone 1000 (whether the cellular phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight or sensing light source which emits near-infrared light is provided in the display portion, an image of finger veins, palm veins, or the like can be taken.

Figure 29B:
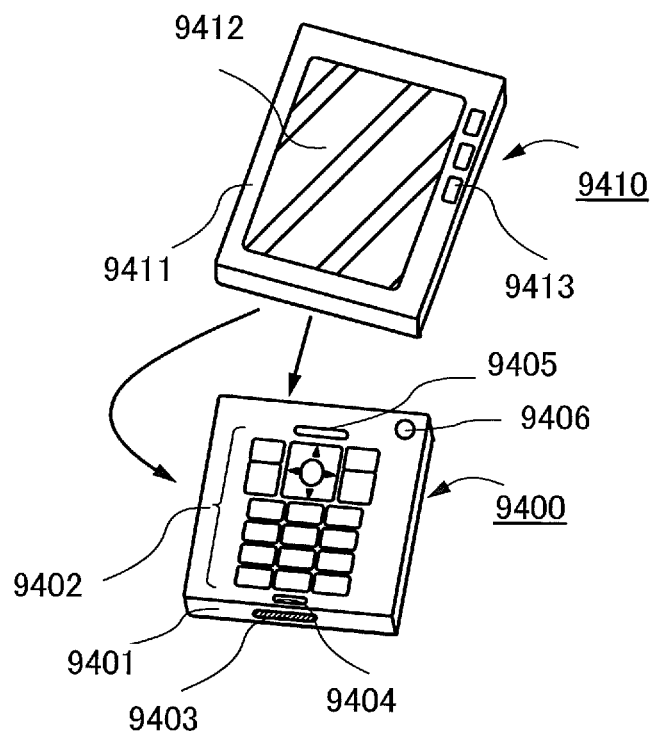

FIG. 29B illustrates another example of a cellular phone. The cellular phone in FIG. 29B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 which has a display function can be detachably attached to the communication device 9400 which has a phone function in two directions represented by the allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This application is based on Japanese Patent Application serial no. 2008-258992 filed with Japan Patent Office on Oct. 3, 2008, the entire contents of which are hereby incorporated by reference.

The invention claimed is:

1. A semiconductor device comprising:
   a first transistor including a first oxide semiconductor layer, a first gate electrode and a first gate insulating layer between the first oxide semiconductor layer and the first gate electrode;
   a second transistor including a second oxide semiconductor layer and a second gate electrode and a second gate insulating layer between the second oxide semiconductor layer and the second gate electrode; and
   a wiring electrically connected to the first oxide semiconductor layer and the second oxide semiconductor layer,
   wherein a length of the first oxide semiconductor layer in a first channel length direction is larger than a length of the first gate electrode in the first channel length direction,
   wherein a length of the second oxide semiconductor layer in a second channel length direction is smaller than a length of the second gate electrode in the second channel length direction,
   wherein the second gate insulating layer has an opening over the second gate electrode, and
   wherein the wiring is in direct contact with the second gate electrode through the opening.

2. The semiconductor device according to claim 1, wherein each of the first oxide semiconductor layer and the second oxide semiconductor layer includes a region with a depression.

3. The semiconductor device according to claim 1, wherein each of the first oxide semiconductor layer and the second oxide semiconductor layer comprise indium, gallium, and zinc.

4. The semiconductor device according to claim 1, wherein each of the first transistor and the second transistor is an n-channel transistor.

5. An electronic appliance comprising the semiconductor device according to claim 1, further comprising an operation button, a speaker, and a microphone.

6. A semiconductor device comprising:
a first transistor including a first oxide semiconductor layer, a first gate electrode and a first gate insulating layer between the first oxide semiconductor layer and the first gate electrode;
a second transistor including a second oxide semiconductor layer and a second gate electrode and a second gate insulating layer between the second oxide semiconductor layer and the second gate electrode;
a first wiring electrically connected to the first oxide semiconductor layer and the second oxide semiconductor layer; and
a second wiring electrically connected to the second oxide semiconductor layer,
wherein a length of the first oxide semiconductor layer in a first channel length direction is larger than a length of the first gate electrode in the first channel length direction,
wherein a length of the second oxide semiconductor layer in a second channel length direction is smaller than a length of the second gate electrode in the second channel length direction,
wherein the second gate insulating layer has an opening over the second gate electrode, and
wherein the second wiring is in direct contact with the second gate electrode through the opening.

7. The semiconductor device according to claim 6, wherein each of the first oxide semiconductor layer and the second oxide semiconductor layer includes a region with a depression.

8. The semiconductor device according to claim 6, wherein each of the first oxide semiconductor layer and the second oxide semiconductor layer comprise indium, gallium, and zinc.

9. The semiconductor device according to claim 6, wherein each of the first transistor and the second transistor is an n-channel transistor.

10. An electronic appliance comprising the semiconductor device according to claim 6, further comprising an operation button, a speaker, and a microphone.

* * * * *